United States Patent
Horii et al.

(10) Patent No.: US 8,685,866 B2
(45) Date of Patent: Apr. 1, 2014

(54) METHOD OF MANUFACTURING SEMICONDUCTOR DEVICE AND SUBSTRATE PROCESSING APPARATUS

(75) Inventors: Sadayoshi Horii, Toyama (JP); Atsushi Sano, Toyama (JP); Masahito Kitamura, Toyama (JP); Yoshitake Kato, Sagamihara (JP)

(73) Assignees: Hitachi Kokusai Electric, Inc., Tokyo (JP); Renesas Electronics Corp., Tokyo (JP)

( * ) Notice: Subject to any disclaimer, the term of this patent is extended or adjusted under 35 U.S.C. 154(b) by 628 days.

(21) Appl. No.: 12/822,317

(22) Filed: Jun. 24, 2010

(65) Prior Publication Data
US 2011/0008955 A1 Jan. 13, 2011

(30) Foreign Application Priority Data
Jul. 7, 2009 (JP) .................................. 2009-161171

(51) Int. Cl.
*H01L 21/31* (2006.01)

(52) U.S. Cl.
USPC .................... 438/785; 438/786; 257/E21.295; 427/255.19

(58) Field of Classification Search
USPC ........................ 438/785, 786; 257/E21.295; 427/255.19
See application file for complete search history.

(56) References Cited

FOREIGN PATENT DOCUMENTS

| JP | 2003115609 | 4/2003 |
|---|---|---|
| JP | 2004-214602 | 7/2004 |
| JP | 2008053683 | 3/2008 |
| JP | 2008244428 | 10/2008 |
| KR | 1020010092714 | 10/2001 |
| KR | 1020050005726 | 1/2005 |
| KR | 1020060082478 | 7/2006 |
| KR | 1020070016071 | 2/2007 |
| WO | 2009057589 | 5/2009 |

*Primary Examiner* — Zandra Smith
*Assistant Examiner* — Toniae Thomas
(74) *Attorney, Agent, or Firm* — Brundidge & Stanger, P.C.

(57) ABSTRACT

A method of manufacturing a semiconductor device including alternately repeating a process of forming a first metal oxide film including a first metal element and a process of forming a second metal oxide film including a second metal element on a substrate accommodated in a processing chamber, so as to form a third metal oxide film including the first and second metal elements with a predetermined composition ratio on the substrate. One of the first and second metal elements of the third metal oxide film has a concentration higher than a concentration of the other, and one of the first and second metal oxide films including the higher-concentration metal element is formed in a chemical vapor deposition (CVD) mode or an atomic layer deposition (ALD) saturation mode, and the other of the first and second metal oxide films is formed in an ALD unsaturation mode.

10 Claims, 10 Drawing Sheets

METHOD OF MANUFACTURING SEMICONDUCTOR DEVICE AND SUBSTRATE PROCESSING APPARATUS

CROSS-REFERENCE TO RELATED PATENT APPLICATION

This U.S. non-provisional patent application claims priority under 35 U.S.C. §119 of Japanese Patent Application No. 2009-161171, filed on Jul. 7, 2009, in the Japanese Patent Office, the entire contents of which are hereby incorporated by reference.

BACKGROUND OF THE INVENTION

1. Field of the Invention

The present invention relates to a method of manufacturing a semiconductor device for processing a substrate, and a substrate processing apparatus.

2. Description of the Related Art

As one of processes for manufacturing a semiconductor device such as a dynamic random access memory (DRAM), a process of forming a third metal oxide film containing first and second metal elements is performed by alternately repeating a plurality of times a process of forming a first metal oxide film containing the first metal element on a substrate such as a silicon wafer and a process of forming a second metal oxide film containing the second metal element.

The composition ratio of the first and second metal elements in the third metal oxide film is determined by the thickness of the first metal oxide film and the thickness of the second metal oxide film formed in each process. The composition ratio in the thickness direction of the third metal oxide film becomes uniform as the first and second metal elements reciprocally diffuse between the alternately stacked first and second metal oxide films.

[Patent Document 1] Japanese Unexamined Patent Application Publication No. 2004-214602

However, at a certain composition ratio of the third metal oxide film, the first and second metal elements may not reciprocally diffuse between the first and second metal oxide films to sufficient degree. In this case, the composition ratio of the third metal oxide film may not be uniform in the thickness direction of the third metal oxide film.

SUMMARY OF THE INVENTION

An object of the present invention is to provide a method of manufacturing a semiconductor device and a substrate processing apparatus for improving the composition ratio uniformity of a third metal oxide film containing first and second metal elements in the thickness direction of the third metal oxide film when the third metal oxide film is formed.

According to an aspect of the present invention, there is provided a method of manufacturing a semiconductor device including alternately repeating a process of forming a first metal oxide film including a first metal element and a process of forming a second metal oxide film including a second metal element on a substrate accommodated in a processing chamber, so as to form a third metal oxide film including the first and second metal elements with a predetermined composition ratio on the substrate, wherein one metal element of the first and second metal elements of the third metal oxide film has a concentration higher than a concentration of the other metal element of the first and second metal elements, and one of the first and second metal oxide films including the higher-concentration metal element is formed in a chemical vapor deposition (CVD) mode or an atomic layer deposition (ALD) saturation mode, and the other of the first and second metal oxide films including the other metal element having a lower-concentration is formed in an ALD unsaturation mode.

According to another aspect of the present invention, there is provided a method of manufacturing a semiconductor device including repeating a process of sequentially forming at least two kinds of metal oxide films on a substrate so as to form a metal oxide film including at least two kinds of metal elements with a predetermined composition ratio on the substrate, wherein one of the at least two kinds of metal elements of the metal oxide film with the predetermined composition ratio has a highest-concentration of the at least two kinds of metal elements, and one of the at least two kinds of metal oxide films including the highest-concentration metal element is formed in a CVD mode or an ALD saturation mode, and the other of at least two kinds of metal oxide films including the metal element having a lower-concentration than the highest-concentration is formed in an ALD unsaturation mode.

According to another aspect of the present invention, there is provided a substrate processing apparatus including: a processing chamber configured to accommodate a substrate; a heater configured to heat the substrate in the processing chamber; a first precursor supply system configured to supply a first precursor including a first metal element into the processing chamber; a second precursor supply system configured to supply a second precursor including a second metal element into the processing chamber; an oxidant supply system configured to supply an oxidant into the processing chamber; an exhaust system configured to exhaust an inside of the processing chamber; and a controller, wherein the controller is configured to control the first precursor supply system, the second precursor supply system, the oxidant supply system, the heater, and the exhaust system so as to: form a first metal oxide film including the first metal element by supplying the first precursor and the oxidant into the processing chamber in which the substrate is accommodated and exhausting the first precursor and the oxidant; form a second metal oxide film including the second metal element by supplying the second precursor and the oxidant into the processing chamber in which the substrate is accommodated and exhausting the second precursor and the oxidant; and form a third metal oxide film including the first and second metal elements with a predetermined composition ratio by alternately repeating the forming of the first metal oxide film and the forming of the second metal oxide film, wherein one metal element of the first and second metal elements of the third metal oxide film has a concentration higher than a concentration of the other metal element of the first and second metal elements, and one of the first and second metal oxide films including the higher-concentration metal element is formed in a CVD mode or an ALD saturation mode, and the other of the first and second metal oxide films including the other metal element having a lower-concentration is formed in an ALD unsaturation mode.

BRIEF DESCRIPTION OF THE DRAWINGS

FIG. 15A and FIG. 15B are schematic views illustrating a vertical processing furnace of a vertical apparatus according to another embodiment of the present invention, in which FIG. 15A is a vertical sectional view illustrating the vertical processing furnace and FIG. 15B is a sectional view of the vertical processing furnace taken along line A-A of FIG. 15A.

DETAILED DESCRIPTION OF THE PREFERRED EMBODIMENTS

Figure 1:
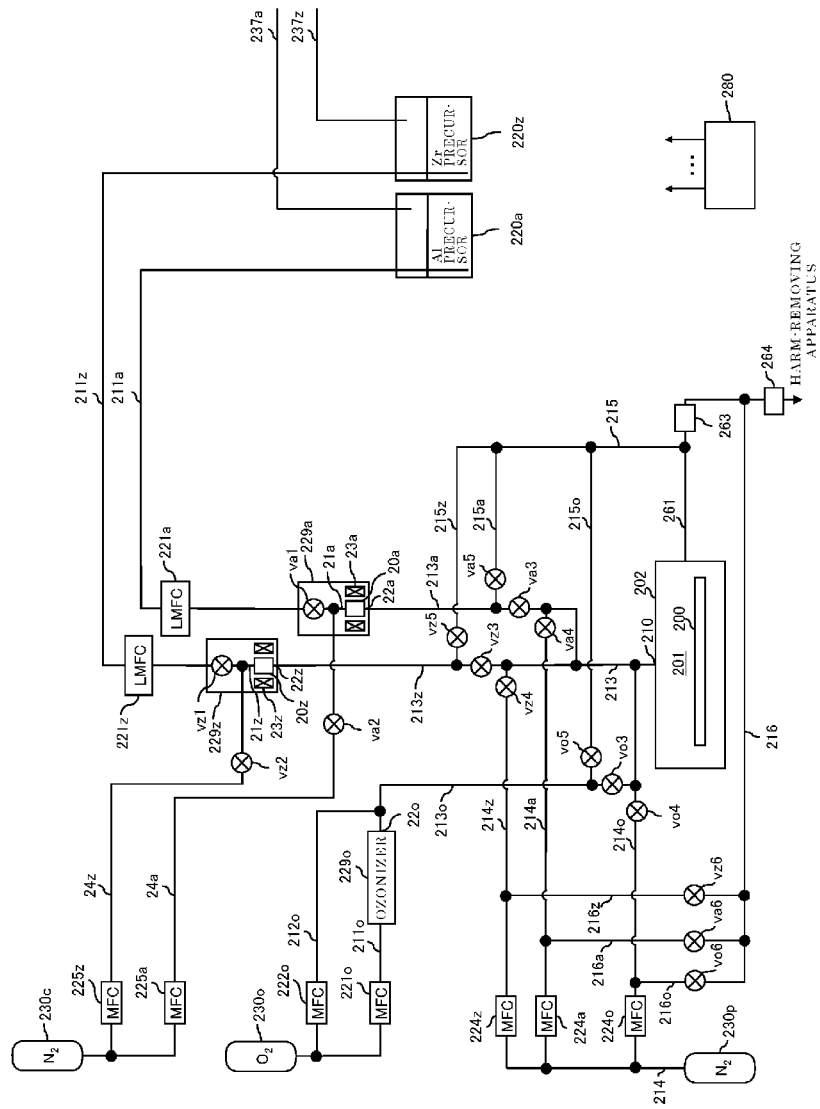
FIG. 1 is a view illustrating a gas supply system of a substrate processing apparatus relevant to an embodiment of the present invention.

Before describing embodiments of the present invention, knowledge of the inventors will be first explained.

(Knowledge about Critical Film Thickness)

As described above, the composition ratio of the first and second metal elements in the third metal oxide film is determined by the thickness of the first metal oxide film and the thickness of the second metal oxide film formed in each process.

When the first and second metal oxide films are formed, an atomic layer deposition (ALD) method as well as a chemical vapor deposition (CVD) method is used because the ALD method is effective for precisely controlling film thickness. When the ALD method is used, the first metal oxide film is formed by performing at least once a process (cycle) of alternately supplying a first precursor (containing the first metal element) and an oxidant into a processing chamber in which a substrate is accommodated. Furthermore, the second metal oxide film is formed by performing at least once a process (cycle) of alternately supplying a second precursor (containing the second metal element) and an oxidant into the processing chamber in which the substrate is accommodated. By respectively adjusting the number of cycles of the process of forming the first metal oxide film and the number of cycles of the process of forming the second metal oxide film, the thickness of the first metal oxide film and the thickness of the second metal oxide film are respectively controlled to predetermined thicknesses so that the composition of the third metal oxide film can be controlled.

For example, a process of forming a $ZrO_2$ film (a zirconium oxide film, hereinafter also referred to as a ZrO film) containing Zr (zirconium) on a substrate, and a process of forming a $Al_2O_3$ film (an aluminum oxide film, hereinafter also referred to as an AlO film) containing aluminum are alternately repeated a plurality of times in order to form a ZrAlO film (zirconium aluminate film) on the substrate. In this case, Zr corresponds to the first metal element; Al corresponds to the second metal element; the ZrO film corresponds to the first metal oxide film; the AlO film corresponds to the second metal oxide film; and the ZrAlO film corresponds to the third metal oxide film. If an ALD method is used in the ZrO film forming process, in the processing chamber in which the substrate is accommodated, Zr precursor introduction→Zr precursor purge→oxidant introduction→oxidant purge are set as one cycle, and the cycle is performed at least once. Furthermore, in the AlO film forming process inside the processing chamber in which the substrate is accommodated, Al precursor introduction→Al precursor purge→oxidant introduction→oxidant purge are set as one cycle, and the cycle is performed at least once.

If the thickness of the Zr film formed in each cycle and the thickness of the AlO film formed in each cycle are both 1 Å, the composition ratio of ZrO:AlO in the ZrAlO film can be adjusted to 1:1 by performing the same number of cycles of the ZrO film forming process as the number of cycles of the AlO film forming process. For example, the execution number of the cycle of the ZrO film forming process and the execution number of the cycle of the AlO film forming process may both be set to one, and a set constituted by the ZrO film forming process and the AlO film forming process may be performed 50 times. In the case, ZrO films each having a thickness of about 1 Å and AlO films having a thickness of about 1 Å may be alternately stacked, and thus a ZrAlO film having a thickness of 100 Å and a ZrO:AlO composition ratio of 1:1 by may be formed.

As described above, in the case where the Zr film having a thickness of about 1 Å and the AlO film having a thickness of about 1 Å are alternately stacked, Zr and Al diffuse to each other between the ZrO film and the AlO film during the film forming process. As a result, the composition ratio of the ZrAlO film can be uniform in the thickness direction of the ZrAlO film.

Figure 10:
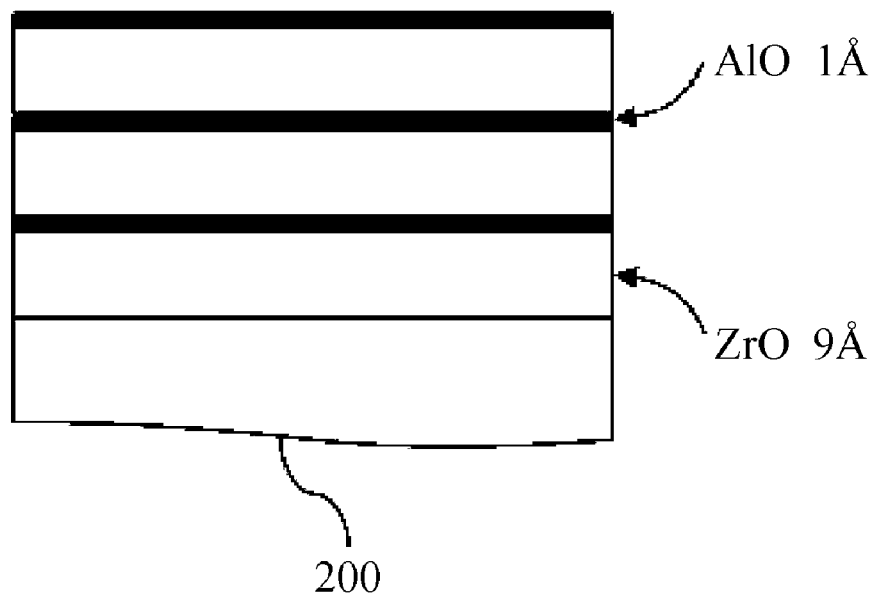
FIG. 10 is a schematic sectional view illustrating a ZrAlO film formed by alternately stacking a ZrO film having a thickness of 9 Å and a AlO film having a thickness of 1 Å.

However, the inventors have found the following fact: at a certain composition ratio of the third metal oxide film, the composition ratio of the third metal oxide film becomes non-uniform in the thickness direction of the third metal oxide film (uneven composition ratio in the thickness direction). For example, when a ZrAlO film having a ZrO:AlO composition ratio of 9:1 is formed, the execution number of the cycle of a ZrO film forming process may be set to nine times, and the execution number of the cycle of an AlO film forming process may be set to once, for alternately stacking a ZrO film having a thickness of 9 Å and an AlO film having a thickness of 1 Å as shown in FIG. 10. However, in this case, since the ZrO film is thick, reciprocal diffusion of ZrO and AlO between the ZrO film and the AlO film may not be sufficient, and thus the ZrO:AlO composition ratio of the ZrAlO film may be not uniform in the thickness direction of the ZrAlO film. That is, although the ZrO:AlO composition ratio of the ZrAlO film can be totally 9:1, the ZrO:AlO composition ratio may not be 9:1 in some regions of the ZrAlO film. Therefore, particularly in the case where the concentration (proportion) of an element of a plurality of elements constituting a metal oxide film is adjusted to several percents (%), for example, 4% to 5%, that is, in the case of low-concentration controlling, there may be some problems.

The inventors have studied to solve the above-described problems. As a result, the inventors have found the following fact. In the case where a metal oxide film containing two or more kinds of metal elements with a predetermined composition ratio is formed by alternately repeating CVD or ALD processes of forming two or more kinds of metal oxide films, the two or more kinds of metal elements can diffuse uniformly to each other between the two or more kinds of metal oxide films during the filming forming processes when the thickness of the metal oxide film formed in each process is equal to or smaller than the critical thickness. In other words, if any one of the two or more kinds of metal oxide films has a thickness per process which is greater than the critical thickness, sufficient diffusion may not occur between the two or more kinds of metal oxide films, and particularly, the composition ratio of the metal oxide film may be uneven in the thickness direction of the metal oxide film. The inventors have found that the critical thickness is about 4 Å.

Figure 9:
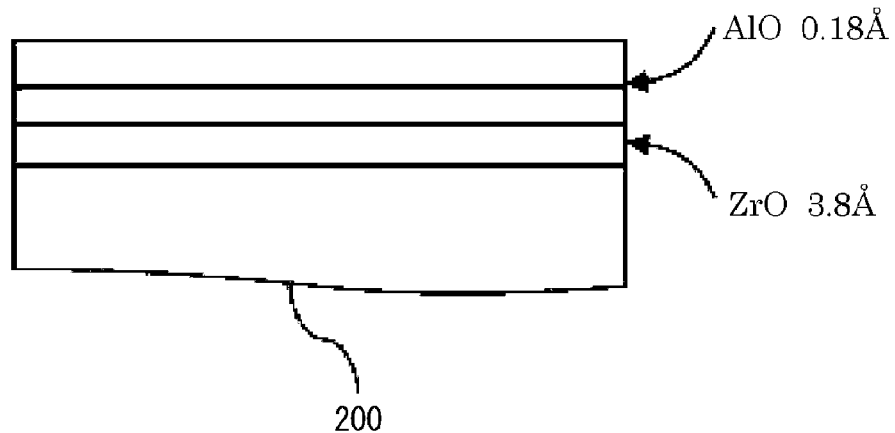
FIG. 9 is a schematic sectional view illustrating a ZrAlO film formed by alternately stacking a ZrO film having a thickness of 3.8 Å and an AlO film having a thickness of 0.18 Å.

In addition, the inventors have found the following fact. If the thickness of a metal oxide film containing a highest-concentration metal element is adjusted in each process to a predetermined thickness (0.8 Å to 4 Å) equal to or smaller than the critical thickness and the thickness of a metal oxide film containing a lower-concentration metal element is adjusted in each process to a thickness based on the predetermined thickness in accordance with a predetermined composition ratio of a metal oxide film containing two or more kinds of metal elements, the metal oxide film having the predetermined composition ratio can be formed, and during the film forming process, two or more kinds of metal elements can diffuse uniformly between two or more kinds of metal oxide films (both in a wafer surface direction and a film thickness direction). For example, when a ZrAlO film having a ZrO:AlO composition ratio of 95.5:4.5 is formed, as shown in FIG. 9, the thickness of a ZrO film (a metal oxide film containing a highest-concentration metal element) is adjusted in each process to 3.8 Å, and the thickness of an AlO film (a metal oxide film containing a metal element having a concentration lower than that of Zr) is adjusted in each process to 3.8 Å×4.5/95.5=0.18 Å, and the films are alternately stacked.

As a result, a metal oxide film having a predetermined composition ratio (ZrO:AlO=95.5:4.5) can be formed, and during the film forming process, ZrO and AlO can sufficiently diffuse to each other for uniform composition ratio (both in a wafer surface direction and a film thickness direction). For illustrative purpose, FIG. 9 illustrates a state before ZrO and AlO diffuse to each other.

(Knowledge about Film Thickness Control)

If the thickness of a metal oxide film containing a highest-concentration metal element is adjusted in each process to a predetermined thickness (0.8 Å to 4 Å) equal to or smaller than the above-described critical thickness, the thickness of a metal oxide film containing a metal element having a lower-concentration (for example, several percents (%)) is necessary to be adjusted in each process to a very small thickness. For example, as described above, in the case where a ZrAlO film having a ZrO:AlO composition ratio of 95.5:4.5 is formed, if the thickness of a ZrO film is adjusted in each process to 3.8 Å, the thickness of an AlO film is necessary to be adjusted in each process to 0.18 Å. However, it is difficult to form an AlO film having such a thickness by using a conventional CVD or ALD method.

Therefore, the inventors have studied and found that a film having such a thickness can be formed by forming a metal oxide film having a highest-concentration metal element in CVD mode or ALD saturation mode, and forming a metal oxide film having a lower-concentration in ALD unsaturation mode. Here, the CVD mode means a film forming mode in which the processing temperature (substrate temperature) is set to about a self-decomposition temperature of a precursor gas. In addition, the ALD saturation mode means a filming forming mode, in which the processing temperature (substrate temperature) is set to a temperature where a precursor gas does not decompose by itself, and the precursor gas is supplied to a substrate until adsorption of the precursor gas on the substrate is saturated (until adsorption of molecules of precursor gas on the substrate is saturated and self limit effect occurs) (refer to FIG. 7). In addition, the ALD unsaturation mode means a filming forming mode, in which the processing temperature (substrate temperature) is set to a temperature where a precursor gas does not decompose by itself, and supply of the precursor gas to a substrate is stopped before adsorption of the precursor gas on the substrate is saturated (before adsorption of molecules of precursor gas on the substrate is saturated and self limit effect occurs) (refer to FIG. 8).

The present invention is proposed based on the knowledge of the inventors.

<Embodiments of Invention>

Hereinafter, embodiments of the present invention will now be described with reference to the attached drawings.

(1) Structure of Substrate Processing Apparatus

Figure 3:
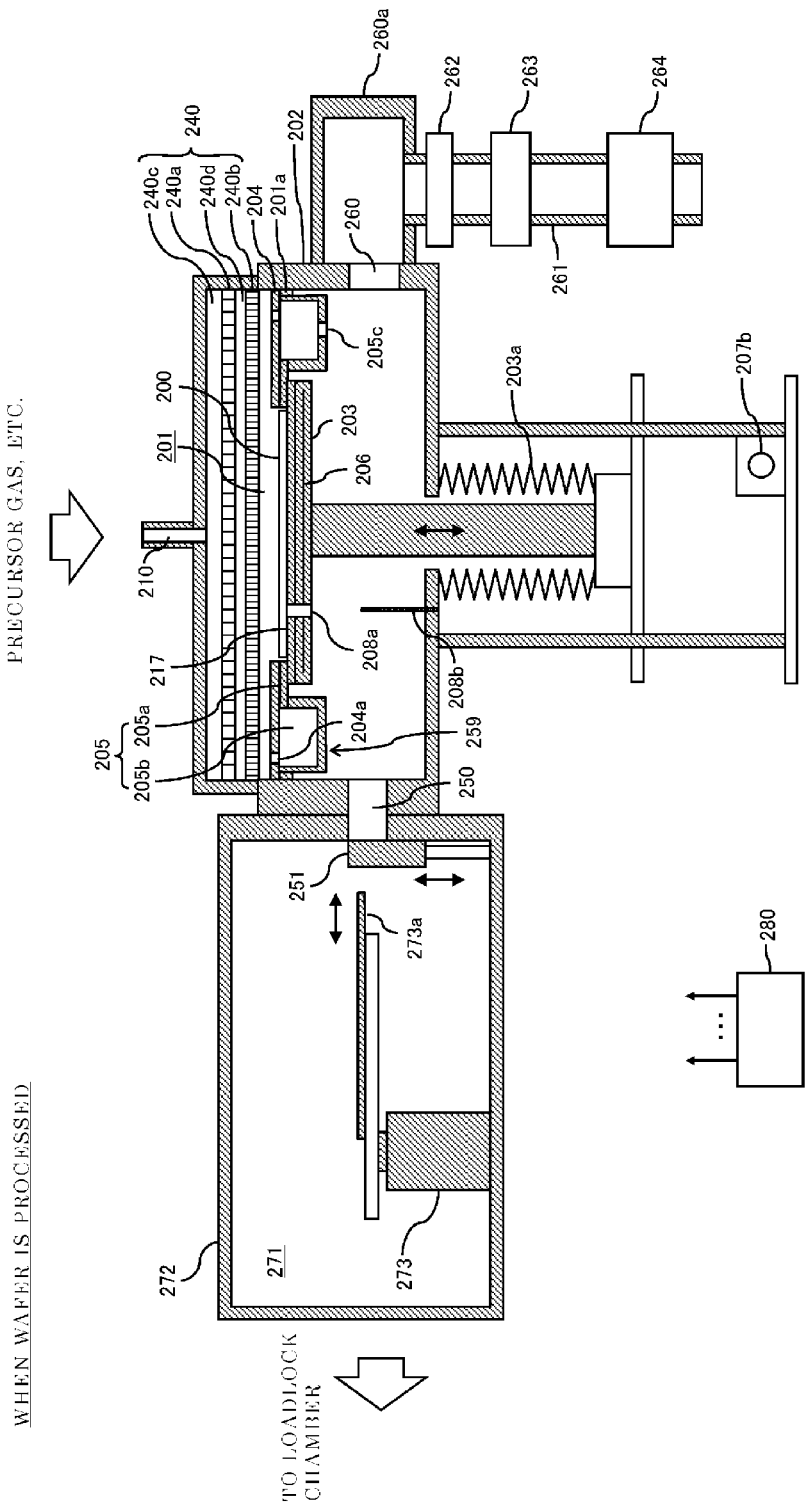
FIG. 3 is a sectional view illustrating the substrate processing apparatus when a wafer is processed according to an embodiment of the present invention.

First, the structure of a substrate processing apparatus relevant to the current embodiments will be described with reference to FIG. 3 and FIG. 4. FIG. 3 is a sectional view illustrating the substrate processing apparatus when a wafer is processed according to an embodiment of the present invention, and FIG. 4 is a sectional view illustrating the substrate processing apparatus when the wafer is carried according to an embodiment of the present invention.

(Processing Chamber)

Figure 4:
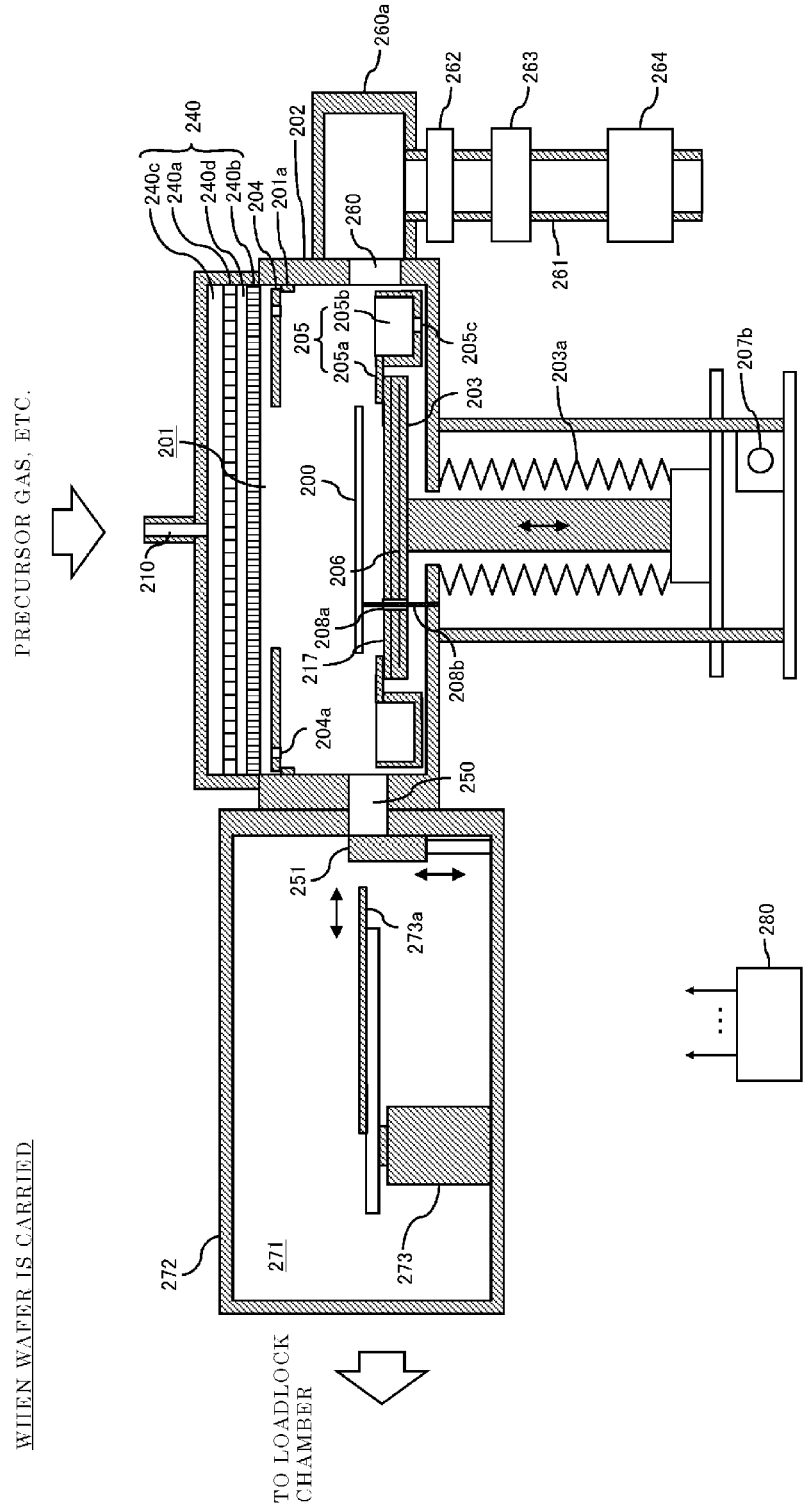
FIG. 4 is a sectional view illustrating the substrate processing apparatus when a wafer is carried according to an embodiment of the present invention.

As shown in FIG. 3 and FIG. 4, the substrate processing apparatus relevant to the current embodiments includes a processing vessel 202. For example, the processing vessel 202 is a flat airtight vessel having a circular cross sectional shape. In addition, the processing vessel 202 is made of a metal material such as aluminum (Al) or stainless steel (e.g., SUS described in the Japanese industrial standard). In the processing vessel 202, a processing chamber 201 is formed to process a substrate such as a wafer 200 (e.g., a silicon wafer).

In the processing chamber 201, a support stage 203 is installed to support a wafer 200. On the top surface of the support stage 203 that makes direct contact with the wafer 200, a susceptor 217 made of a material such as quartz ($SiO_2$), carbon, a ceramic material, silicon carbide (SiC), aluminum oxide ($Al_2O_3$), or aluminum nitride (AlN) is installed as a support plate.

In the support stage 203, a heater 206 is built as a heating unit (heating source) configured to heat the wafer 200. The lower end part of the support stage 203 penetrates the bottom side of the processing vessel 202.

At the outside of the processing chamber 201, an elevating mechanism 207b is installed to lift and lower the support stage 203. By operating the elevating mechanism 207b to lift and lower the support stage 203, the wafer 200 supported on the susceptor 217 can be lifted and lowered. When the wafer 200 is carried, the support stage 203 is lowered to a position (wafer carrying position) shown in FIG. 4, and when the wafer 200 is processed, the support stage 203 is raised to a position (wafer processing position) shown in FIG. 3. The lower end part of the support stage 203 is surrounded by a bellows 203a so that the inside of the processing chamber 201 can be hermetically maintained.

In addition, on the bottom surface (floor surface) of the processing chamber 201, for example, three lift pins 208b are installed in a manner such that the lift pins 208b are perpendicularly erected. Furthermore, in the support stage 203 (including the susceptor 217), penetration holes 208a are respectively formed at positions corresponding to the lift pins 208b so that the lift pins 208b can be inserted through the penetration holes 208a. Therefore, when the support stage 203 is lowered to the wafer carrying position, as shown in FIG. 4, upper parts of the lift pins 208b protrude from the top surface of the susceptor 217 so that the lift pins 208b can support the wafer 200 from the bottom side of the wafer 200. In addition, when the support stage 203 is raised to the wafer processing position, as shown in FIG. 3, the lift pins 208b are retracted from the top surface of the susceptor 217 so that the susceptor 217 can support the wafer 200 from the bottom side of the wafer 2. Since the lift pins 208b make direct contact with the wafer 200, it is preferable that the lift pins 208b be made of a material such as quartz or aluminum.

(Wafer Carrying Entrance)

At a side of the inner wall of the processing chamber 201 (processing vessel 202), a wafer carrying entrance 250 is installed so that a wafer 200 can be carried into and out of the processing chamber 201 through wafer carrying entrance 250. At the wafer carrying entrance 250, a gate valve 251 is installed so that the inside of the processing chamber 201 can communicate with the inside of a carrying chamber (preliminary chamber) 271 by opening the gate valve 251. The carrying chamber 271 is formed in a carrying vessel (airtight vessel) 272, and in the carrying chamber 271, a carrying robot 273 is installed to carry a wafer 200. The carrying robot 273 includes a carrying arm 273a to support a wafer 200 when the wafer 200 is carried. In a state where the support stage 203 is lowered to the wafer carrying position, if the gate valve 251 is opened, a wafer 200 can be carried between the inside of the processing chamber 201 and the inside of the carrying chamber 271 by using the carrying robot 273. A wafer 200 carried into the processing chamber 201 is temporarily placed on the lift pins 208b as described above. In addition, at a side of the carrying chamber 271 opposite to the wafer carrying entrance 250, a loadlock chamber (not shown) is installed, and a wafer 200 can be carried between the inside of the loadlock chamber and the inside of the carrying chamber 271 by using the carrying robot 273. The loadlock chamber is used as a preliminary chamber to temporarily accommodate a non-processed or processed wafer 200.

(Exhaust System)

At a side of the inner wall of the processing chamber 201 (processing vessel 202) opposite to the wafer carrying entrance 250, an exhaust outlet 260 is installed for exhaust the inside atmosphere of the processing chamber 201. An exhaust pipe 261 is connected to the exhaust outlet 260 through an exhaust chamber 260a, and at the exhaust pipe 261, a pressure regulator 262 such as an auto pressure controller (APC) configured to control the inside pressure of the processing chamber 201, a precursor collection trap 263, and a vacuum pump 264 are sequentially connected in series. An exhaust system (exhaust line) is constituted mainly by the exhaust outlet 260, the exhaust chamber 260a, the exhaust pipe 261, the pressure regulator 262, the precursor collection trap 263, and the vacuum pump 264.

(Gas Inlet)

At the top surface (the ceiling wall) of a later-described shower head 240 installed at an upper part of the processing chamber 201, a gas inlet 210 is installed to introduce various gases into the processing chamber 201. A gas supply system connected to the gas inlet 210 will be described later.

(Shower Head)

Between the gas inlet 210 and the processing chamber 201, the shower head 240 is installed as a gas distributing mechanism. The shower head 240 includes a distributing plate 240a configured to distribute a gas introduced through the gas inlet 210, and a shower plate 240b configured to distribute the gas passing through the distributing plate 240a more uniformly and supply the gas to the surface of a wafer 200 placed on the support stage 203. A plurality of ventilation holes are formed in the distributing plate 240a and the shower plate 240b. The distributing plate 240a is disposed to face the top surface of the shower head 240 and the shower plate 240b, and the shower plate 240b is disposed to face the wafer 200 placed on the support stage 203. Spaces are formed between the top surface of the shower head 240 and the distributing plate 240a and between the distributing plate 240a and the shower plate 240b, respectively. The spaces function as a first buffer space (distributing chamber) 240c through which gas supplied through the gas inlet 210 is distributed and a second buffer space 240d through which gas passing through the distributing plate 240a is diffused.

(Exhaust Duct)

In the side surface of the inner wall of the processing chamber 201, a stopper 201a is installed. The stopper 201a is configured to hold a conductance plate 204 at a position close to the wafer processing position. The conductance plate 204 is a doughnut-shaped (ring-shaped) circular disk having an opening to accommodate the wafer 200 along its inner circumferential part. A plurality of discharge outlets 204a are formed in the outer circumferential part of the conductance plate 204 in a manner such that the discharge outlets 204a are arranged at predetermined intervals in the circumferential direction of the conductance plate 204. The discharge outlets 204a are discontinuously formed so that the outer circumferential part of the conductance plate 204 can support the inner circumferential part of the conductance plate 204.

A lower plate 205 latches onto the outer circumferential part of the support stage 203. The lower plate 205 includes a ring-shaped concave part 205b and a flange part 205a formed as a part of the inner upper side of the concave part 205b. The concave part 205b is installed to close a gap between the outer circumferential part of the support stage 203 and the lateral surface of the inner wall of the processing chamber 201. At a part of the lower side of the concave part 205b close to the exhaust outlet 260, a plate exhaust outlet 205c is formed to discharge (distribute) gas from the inside of the concave part 205b toward the exhaust outlet 260. The flange part 205a functions as a latching part that latches onto the upper outer circumferential part of the support stage 203. Since the flange part 205a latches onto the upper outer circumferential part of the support stage 203, the lower plate 205 can be lifted together with the support stage 203 when the support stage 203 is lifted.

When the support stage 203 is raised to the wafer processing position, the lower plate 205 is also raised to the wafer processing position. As a result, the top surface of the concave part 205b is blocked by the conductance plate 204 held at a position close to the wafer processing position, and thus a gas flow passage region is formed in the concave part 205b as an exhaust duct 259. At this time, by the exhaust duct 259 (the conductance plate 204 and the lower plate 205) and the support stage 203, the inside of the processing chamber 201 is divided into an upper processing chamber higher than the exhaust duct 259 and a lower processing chamber lower than the exhaust duct 259. Preferably, the conductance plate 204 and the lower plate 205 may be formed of a material that can be held at a high temperature, for example, high temperature resistant and high load resistant quartz.

An explanation will now be given on a gas flow in the processing chamber 201 during a wafer processing process. First, a gas supplied from the gas inlet 210 to the upper side of the shower head 240 flows from the first buffer space (distributing chamber) 240c to the second buffer space 240d through the plurality of holes of the distributing plate 240a, and is then supplied to the inside of the processing chamber 201 through the plurality of holes of the shower plate 240b, so that the gas can be uniformly supplied to the wafer 200. Then, the gas supplied to the wafer 200 flows outward in the radial directions of the wafer 200. After the gas makes contact with the wafer 200, remaining gas is discharged to the exhaust duct 259 disposed at the outer circumference of the wafer 200: that is, the remaining gas flows outward on the conductance plate 204 in the radial directions of the wafer 200 and is discharged to the gas flow passage region (the inside of the concave part 205b) of the exhaust duct 259 through the discharge outlets 204a formed in the conductance plate 204. Thereafter, the gas flows in the exhaust duct 259 and is exhausted through the plate exhaust outlet 205c and the exhaust outlet 260. Since gas is directed to flow in this manner, the gas can be prevented from flowing to the lower part of the processing chamber 201, that is, the rear side of the support stage 203 or the bottom side of the processing chamber 201.

Next, the configuration of the gas supply system connected to the gas inlet 210 will be described with reference to FIG. 1. FIG. 1 illustrates the configuration of the gas supply system (gas supply lines) of the substrate processing apparatus relevant to an embodiment of the present invention.

(Liquid Material Gas Supply System)

At the outside of the processing chamber 201, a first liquid material supply source 220z is installed to supply a first liquid material such as a Zr (zirconium)-containing organic metal liquid material (hereinafter also referred to as a Zr precursor), and a second liquid material supply source 220a is installed to supply a second liquid material such as an Al (aluminum)-containing organic metal liquid material (hereinafter also referred to as an Al precursor). Each of the first liquid material supply source 220z and the second liquid material supply source 220a is configured as a tank (sealed reservoir) in which a liquid material can be contained (filled).

A pressurizing gas supply pipe 237z and a pressurizing gas supply pipe 237a are connected to the first liquid material supply source 220z and the second liquid material supply source 220a, respectively. Pressurizing gas supply sources (not shown) are connected to the upstream end parts of the first and second liquid material supply source 220z and 220a. The downstream end parts of the pressurizing gas supply pipe 237z and the pressurizing gas supply pipe 237a are connected to the upper inner spaces of the first and second liquid material supply sources 220z and 220a so that pressurizing gas can be supplied to the upper inner spaces. Preferably, gas that does not react with the liquid materials is used as the pressurizing gas. For example, inert gas such as $N_2$ gas is used as the pressurizing gas.

In addition, a first liquid material supply pipe 211z and a second liquid material supply pipe 211a are connected to the first liquid material supply source 220z and the second liquid material supply source 220a, respectively. The upstream end parts of the first and second liquid material supply pipes 211z and 211a are placed in the liquid materials contained in the first and second liquid material supply sources 220z and 220a. In addition, the downstream end parts of the first and second liquid material supply pipes 211z and 211a are respectively connected to vaporizers 229z and 229a which are vaporizing units configured to vaporize the liquid materials. Furthermore, at the first and second liquid material supply pipes 211z and 211a, liquid mass flow controllers (LMFC) 221z and 221a are installed as flow rate controllers for controlling the supply flow rates of the liquid materials, and valves vz1 and va1 are installed to control supply of the liquid materials. The valves vz1 and va1 are installed in the vaporizers 229z and 229a.

In the above-described structure, by opening the valves vz1 and va1 and simultaneously supplying pressurizing gas through the pressurizing gas supply pipes 237z and 237a, the liquid materials can be pressurized (supplied) from the first and second liquid material supply sources 220z and 220a to the vaporizers 229z and 229a. A first liquid material supply system (first liquid material supply line) is constituted mainly by the first liquid material supply source 220z, the pressurizing gas supply pipe 237z, the liquid material supply pipe 211z, the LMFC 221z, and the valve vz1. A second liquid material supply system (second liquid material supply line) is constituted mainly by the second liquid material supply source 220a, the pressurizing gas supply pipe 237a, the second liquid material supply pipe 211a, the LMFC 221a, and the valve va1.

(Vaporizing Units)

The vaporizers 229z and 229a, which are vaporizing units configured to vaporize the liquid materials, respectively include: vaporizing chambers 20z and 20a in which precursor gases are generated by vaporizing the liquid materials using heaters 23z and 23a; liquid material flow passages 21z and 21a as flow passages through which the liquid materials are discharged into the vaporizing chambers 20z and 20a; the valves vz1 and va1 for controlling supply of the liquid materials into the vaporizing chambers 20z and 20a; and precursor gas supply outlets 22z and 22a through which precursor gases generated in the vaporizing chambers 20z and 20a are supplied to first and second precursor gas supply pipes 213z and 213a (described later). The downstream end parts of the first and second liquid material supply pipe 211z and 211a are connected to the upstream end parts of the liquid material flow passages 21z and 21a through the valves vz1 and va1. The downstream end parts of carrier gas supply pipes 24z and 24a are connected to the liquid material flow passages 21z and 21a so as to supply carrier gas from the carrier gas supply pipes 24z and 24a to the vaporizing chambers 20z and 20a through the liquid material flow passages 21z and 21a. The upstream end parts of the carrier gas supply pipes 24z and 24a are connected to a $N_2$ gas supply source 230c that supplies $N_2$ gas as a carrier gas. At the carrier gas supply pipes 24z and 24a, MFCs 225z and 225a are installed as flow rate controllers for controlling the supply flow rates of $N_2$ gas, and valves vz2 and va2 are installed to control supply of the $N_2$ gas. A carrier gas supply system (carrier gas supply line) is constituted mainly by the $N_2$ gas supply source 230c, the carrier gas supply pipes 24z and 24a, the MFCs 225z and 225a, and the valves vz2 and va2. The vaporizers 229z and 229a are configured as first and second vaporizing units, respectively.

(Precursor Gas Supply System)

The upstream end parts of the first and second precursor gas supply pipes 213z and 213a are respectively connected to the precursor gas supply outlets 22z and 22a of the vaporizers 229z and 229a to supply precursor gases to the inside of the processing chamber 201. The downstream end parts of the first and second precursor gas supply pipes 213z and 213a are joined together as a precursor gas supply pipe 213, and the precursor gas supply pipe 213 is connected to the gas inlet 210. At the first and second precursor gas supply pipes 213z and 213a, valves vz3 and va3 are respectively installed to control supply of precursor gases.

In the above-described structure, the liquid materials are vaporized in the vaporizers 229z and 229a to generate precursor gases, and the valves vz3 and va3 are simultaneously opened, so that the precursor gases can be supplied from the first and second precursor gas supply pipes 213z and 213a to the inside of the processing chamber 201 through the precursor gas supply pipe 213. A first precursor gas supply system (first precursor gas supply line) is constituted mainly by the first precursor gas supply pipe 213z and the valve vz3, and a second precursor gas supply system (second precursor gas supply line) is constituted mainly by the second precursor gas supply pipe 213a and the valve va3. In addition, a first precursor supply system (Zr precursor supply system) is constituted mainly by the first liquid material supply system, the first vaporizing unit, and the first precursor gas supply system, and a second precursor supply system (Al precursor supply system) is constituted mainly by the second liquid material supply system, the second vaporizing unit, and the second precursor gas supply system.

(Reaction Gas Supply System)

In addition, at the outside of the processing chamber 201, an oxygen gas supply source 230o is installed to supply oxygen ($O_2$) gas. The upstream end part of a first oxygen gas supply pipe 211o is connected to the oxygen gas supply source 230o. An ozonizer 2290 is connected to the downstream end part of the first oxygen gas supply pipe 211o to generate ozone ($O_3$) gas from oxygen gas by using plasma for using the ozone gas as a reaction gas (reactant) (that is, for using the ozone gas as an oxidant). In addition, at the first oxygen gas supply pipe 211o, an MFC 221o is installed as a flow rate controller for controlling the supply flow rate of oxygen gas.

The upstream end part of an ozone gas supply pipe 213o which is a reaction gas supply pipe is connected to an ozone gas supply outlet 22o of the ozonizer 229o. In addition, the downstream end part of the ozone gas supply pipe 213o is connected to the precursor gas supply pipe 213. That is, the ozone gas supply pipe 213o is configured to supply ozone gas into the processing chamber 201 as a reaction gas. In addition, at the ozone gas supply pipe 213o, a valve vo3 is installed to control supply of ozone gas into the processing chamber 201.

In addition, the upstream end part of a second oxygen gas supply pipe 212o is connected to the first oxygen gas precursor pipe 211o at the upstream side of the MFC 221o. Furthermore, the downstream end part of the second oxygen gas supply pipe 212o is connected to the ozone gas supply pipe 213o at the upstream side of the valve vo3. Furthermore, at the second oxygen gas supply pipe 212o, an MFC 222o is installed as a flow rate controller for controlling the supply flow rate of oxygen gas.

In the above-described structure, oxygen gas is supplied to the ozonizer 2290 to generate ozone gas, and the valve vo3 is simultaneously opened, so that ozone gas can be supplied into the processing chamber 201. In addition, when ozone gas is supplied into the processing chamber 201, if oxygen gas is supplied through the second oxygen gas supply pipe 212o, the ozone gas is diluted with the oxygen gas and is then supplied into the processing chamber 201 so that the concentration of the ozone gas can be controlled. A reaction gas supply system (reaction gas supply line) is constituted mainly by the oxygen gas supply source 230o, the first oxygen gas supply pipe 211o, the ozonizer 229o, the MFC 221o, the ozone gas supply pipe 213o, the valve vo3, the second oxygen gas supply pipe 212o, and the MFC 222o.

(Purge Gas Supply System)

In addition, at the outside of the processing chamber 201, a $N_2$ gas supply source 230p is installed to supply $N_2$ gas as a purge gas. The upstream end part of a purge gas supply pipe 214 is connected to the $N_2$ gas supply source 230p. The downstream end part of the purge gas supply pipe 214 branches into three lines: a first purge gas supply pipe 214z, a second purge gas supply pipe 214a, a third purge gas supply pipe 214o. The downstream end parts of the first to third purge gas supply pipes 214z, 214a, and 214o are connected to the downstream sides of the valves vz3, va3, and vo3 of the first precursor gas supply pipe 213z, the second precursor gas supply pipe 213a, and the ozone gas supply pipe 213o, respectively. At the first to third purge gas supply pipes 214z, 214a, and 214o, MFCs 224z, 224a, and 224o are respectively installed as flow rate controllers for controlling the supply flow rates of $N_2$ gas, and valves vz4, va4, and vo4 are respectively installed to control supplies of $N_2$ gas. A purge gas supply system (purge gas supply line) is constituted mainly by the $N_2$ gas supply source 230p, the first purge gas supply pipe 214z, the second purge gas supply pipe 214a, the third purge gas supply pipe 214o, the MFCs 224z, 224a, and 224o, and the valves vz4, va4, and vo4.

(Vent System)

In addition, the upstream end parts of first to third vent pipes 215z, 215a, and 215o are connected to the upstream sides of the valves vz3, va3, and vo3 of the first precursor gas supply pipe 213z, the second precursor gas supply pipe 213a, and the ozone gas supply pipe 213o, respectively. Furthermore, the downstream end parts of the first to third vent pipes 215z, 215a, and 215o are joined together into a vent pipe 215, and the vent pipe 215 is connected to the upstream side of the precursor collection trap 263 of the exhaust pipe 261. At the first to third vent pipes 215z, 215a, and 215o, valves vz5, va5, and vo5 are respectively installed to control supply of gases.

In the above-described structure, by closing the valves vz3, va3, and vo3, and opening the valves vz5, va5, and vo5, gases flowing in the first precursor gas supply pipe 213z, the second precursor gas supply pipe 213a, and the ozone gas supply pipe 213o can be bypassed to the outside of the processing chamber 201 without supplying the gases into the processing chamber 201.

In addition, fourth to sixth vent pipes 216z, 216a, and 216o are respectively connected to the downstream sides of the MFCs 224z, 224a, and 224o which are located at the upstream sides of the valves vz4, va4, and vo4 of the first to third purge gas supply pipes 214z, 214a, and 214o. The downstream sides of the fourth to sixth vent pipes 216z, 216a, and 216o are joined together as a vent pipe 216. The vent pipe 216 is connected to the downstream side of the precursor collection trap 263 of the exhaust pipe 261 but the upstream side of the vacuum pump 264. At the fourth to sixth vent pipes 216z, 216a, and 216o, valves vz6, va6, and vo6 are installed to control supply of gas.

In the above-described structure, by closing the valves vz4, va4, and vo4, and opening the valves vz6, va6, and vo6, $N_2$ gas flowing in the first to third purge gas supply pipes 214z, 214a, and 214o can be bypassed to the outside of the processing chamber 201 without supplying the N₂ gas into the processing chamber 201. In the case where the valves vz3, va3, and vo3 are closed and the valves vz5, va5, and vo5 are opened so as to bypass gases flowing in the first precursor gas supply pipe 213z, the second precursor gas supply pipe 213a, and the ozone gas supply pipe 213o to the outside of the processing chamber 201 without supplying the gases into the processing chamber 201, the valves vz4, va4, and vo4 are opened to introduce N₂ gas into the first precursor gas supply pipe 213z, the second precursor gas supply pipe 213a, and the ozone gas supply pipe 213o for purging the insides of the supply pipes 213z, 213a, and 213o. In addition, the valves vz6, va6, and vo6 are set to be operated in reverse to the valves vz4, va4, and vo4 so that when N₂ gas is not supplied to the precursor gas supply pipes 213z, 213s, and 213o, the N₂ gas can be exhausted by bypassing the processing chamber 201. A vent system (vent lines) is constituted mainly by the first vent pipe 215z; the second vent pipe 215a; the third vent pipe 215o; the vent pipe 215; the fourth vent pipe 216z; the fifth vent pipe 216a; the sixth vent pipe 216o; the vent pipe 216; the valves vz5, va5, and vo5; and the valves vz6, va6, and vo6.

(Controller)

The substrate processing apparatus relevant to the current embodiment includes a controller 280 configured to control each part of the substrate processing apparatus. The controller 280 controls operations of parts such as the gate valve 251, the elevating mechanism 207b, the carrying robot 273, the heater 206, the pressure regulator (APC) 262, the vaporizers 229z and 229a, the ozonizer 229o, the vacuum pump 264, the valves vz1 to vz6, va1 to va6, and vo3 to vo6, the LMFCs 221z and 221a, and the MFCs 225z, 225a, 224z, 224a, 221o, 222o, and 224o.

(2) Substrate Processing Process

Figure 2:
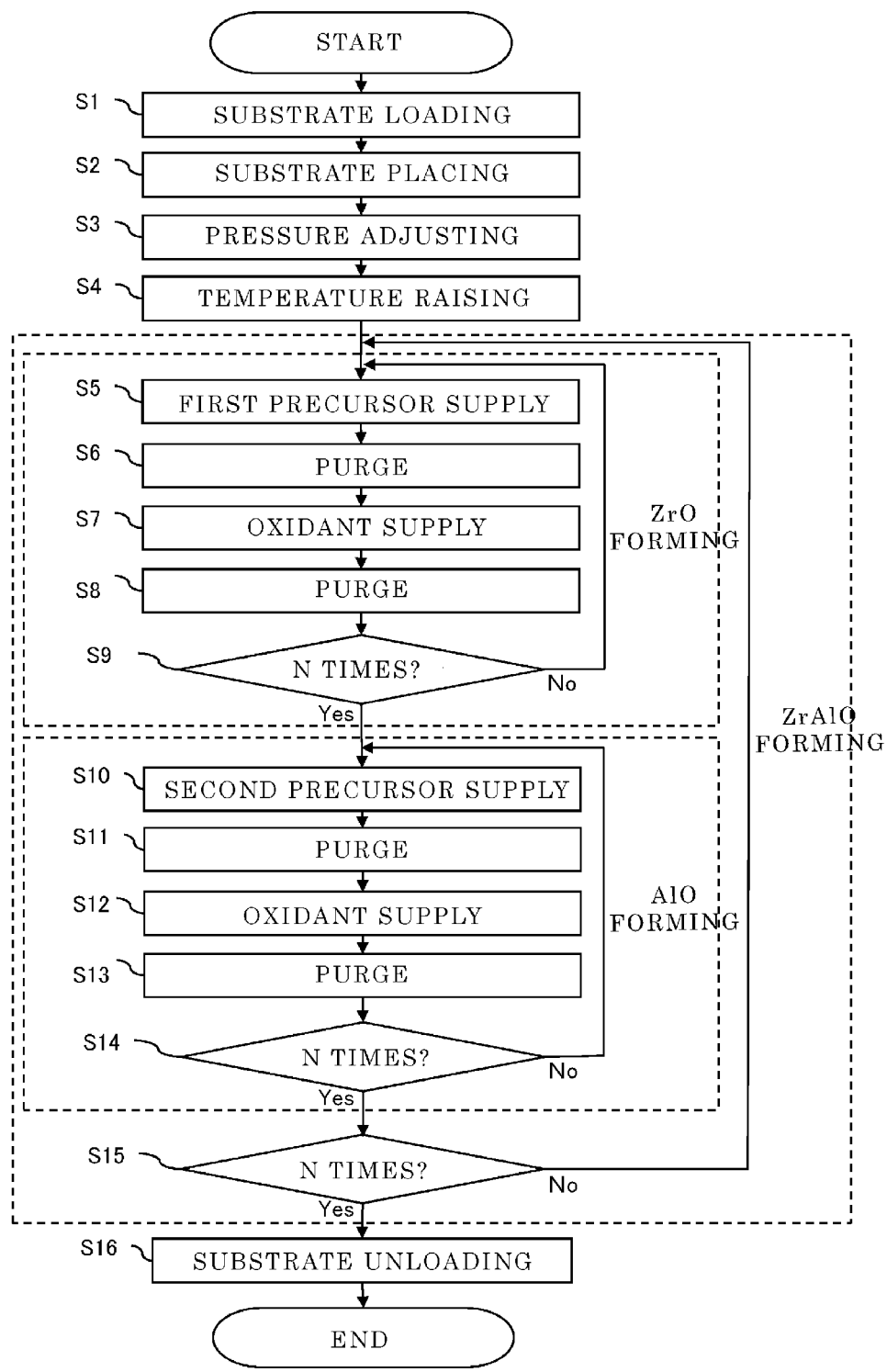
FIG. 2 is a flowchart for explaining a substrate processing process according to an embodiment of the present invention.
Figure 5:
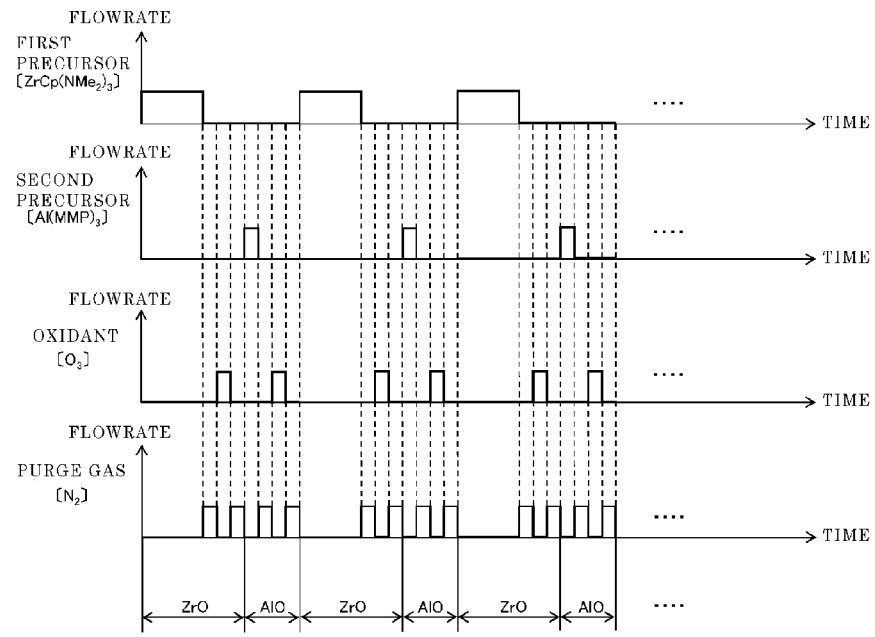
FIG. 5 is a flowchart provided in the form of a timing chart for showing exemplary supply timings when supplies of a first precursor and an oxidant in chemical vapor deposition (CVD) mode and supplies of a second precursor and an oxidant in atomic layer deposition (ALD) unsaturation mode are alternately repeated according to an embodiment of the present invention.
Figure 6:
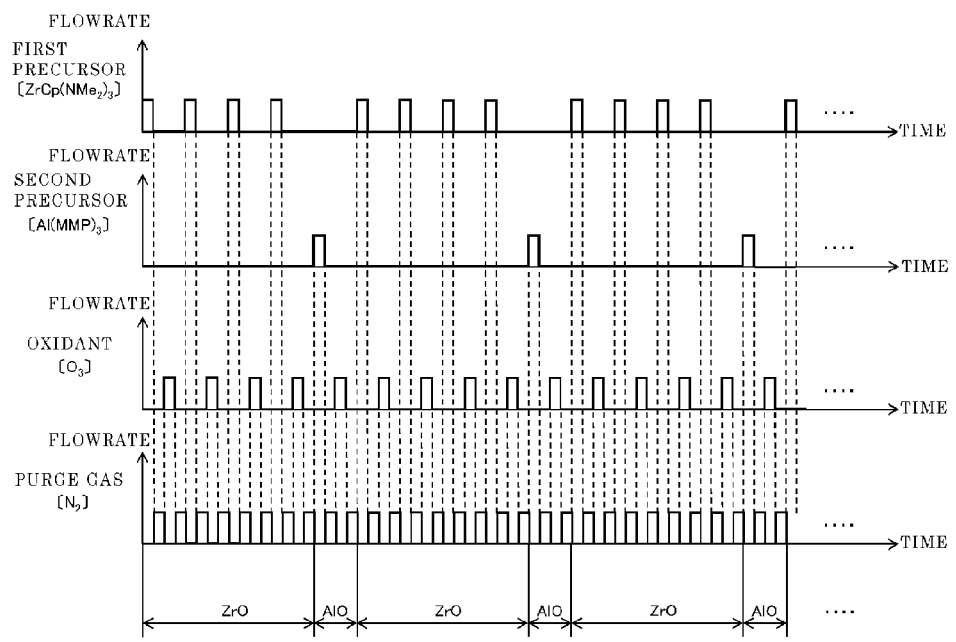
FIG. 6 is a flowchart provided in the form of a timing chart for showing exemplary supply timings when supplies of a first precursor and an oxidant in ALD saturation mode and supplies of a second precursor and an oxidant in ALD unsaturation mode are alternately repeated according to an embodiment of the present invention.

Next, with reference to FIG. 2, FIG. 5, and FIG. 6, one of processes of manufacturing a semiconductor device, that is, a substrate processing process for forming a thin film on a wafer using the above-described substrate processing apparatus, will be explained according to an embodiment of the present invention. FIG. 2 is a flowchart for explaining a substrate processing process according to an embodiment of the present invention. FIG. 5 is a flowchart provided in the form of a timing chart for showing exemplary supply timings when supplies of a first precursor and an oxidant in CVD mode and supplies of a second precursor and an oxidant in ALD unsaturation mode are alternately repeated according to an embodiment of the present invention. FIG. 6 is a flowchart provided in the form of a timing chart for showing exemplary supply timings when supplies of a first precursor and an oxidant in ALD saturation mode and supplies of a second precursor and an oxidant in ALD unsaturation mode are alternately repeated according to an embodiment of the present invention. In the current embodiments, an explanation will be given on the case of using a Zr precursor as a first precursor, an Al precursor as a second precursor; ozone gas as an oxidant so that a zirconium aluminate (ZrAlO) film having a desired ZrO:AlO ratio of 89:11 to 97.4:2.6 can be formed on a wafer. That is, among the plurality of metal elements (Zr, Al) constituting the ZrAlO film, Zr is a metal element having the highest-concentration, and a ZrO film is a metal oxide film containing the highest-concentration metal element. In addition, Al is a metal element having a concentration lower than that of Zr, and an AlO film is a metal oxide film containing the lower-concentration metal element. In the following description, operations of parts constituting the substrate processing apparatus are controlled by the controller 280.

(Substrate Carrying-in Process S1, Substrate Placing Process S2)

First, the elevating mechanism 207b is operated to lower the support stage 203 to the wafer carrying position as shown in FIG. 4. Next, the gate valve 251 is opened so that the processing chamber 201 can communicate with the carrying chamber 271. Next, a wafer 200 to be processed is carried from the carrying chamber 271 to the processing chamber 201 by using the carrying robot 273 in a state where the wafer 200 is supported on the carrying arm 273a (S1). The wafer 200 carried in the processing chamber 201 is temporarily placed on the lift pins 208b protruding from the surface of the support stage 203. Thereafter, the carrying arm 273a of the carrying robot 273 is moved back to the carrying chamber 271, and the gate valve 251 is closed.

Next, the elevating mechanism 207b is operated to raise the support stage 203 to the wafer processing position as shown in FIG. 3. As a result, the lift pins 208b are retracted into the support stage 203, and thus, the wafer 200 is placed on the support stage 203.

(Pressure Adjusting Process S3, Temperature Raising Process S4)

Subsequently, by using the pressure regulator (APC) 262, the inside pressure of the processing chamber 201 is adjusted to a predetermined value (S3). In addition, power supplied to the heater 206 is adjusted to heat the wafer 200 and increase the surface temperature of the wafer 200 to a predetermined processing temperature (S4).

In the substrate carrying-in process S1, the substrate placing process S2, the pressure adjusting process S3, the temperature raising process S4, and a substrate carrying-out process S16 (described later), the vacuum pump 264 is operated in a state where the valves vz3, va3, and vo3 are closed and the valves vz4, va4, and vo4 are opened, so as to create a N₂ gas flow in the processing chamber 201. By this, attachment of particles to the wafer 200 can be suppressed. The vacuum pump 264 is always operated at least from the substrate carrying-in process S1 to the substrate carrying-out process S16.

Along with processes S1 to S4, a first liquid material (Zr precursor) is vaporized to generate a first precursor gas (Zr precursor gas) (preliminary vaporization). That is, while supplying a carrier gas into the vaporizer 229z in a state where the valve vz3 is closed and the vz2 is opened, the valve vz1 is opened, and simultaneously, a pressurizing gas is supplied through the pressurizing gas supply pipe 237z so as to pressurize (supply) the first liquid material from the first liquid material supply source 220z to the vaporizer 229z and vaporize the first liquid material into the first precursor gas inside the vaporizer 229z. In this preliminary vaporizing process, while operating the vacuum pump 264, the valve vz5 is opened in a state where the vz3 is closed so as not to supply the first precursor gas into the processing chamber 201 but exhaust the first precursor gas through a route bypassing the processing chamber 201. In the current embodiment, for example, ZrCp(NMe₂)₃ is used as the first liquid material (Zr precursor).

Furthermore, at this time, a second liquid material (Al precursor) is vaporized to generate a second precursor gas (Al precursor gas) (preliminary vaporization). That is, while supplying a carrier gas into the vaporizer 229a in a state where the valve va3 is closed and the va2 is opened, the valve va1 is opened, and simultaneously, a pressurizing gas is supplied through the pressurizing gas supply pipe 237a so as to pressurize (supply) the second liquid material from the second liquid material supply source 220a to the vaporizer 229a and vaporize the second liquid material into the second precursor gas inside the vaporizer 229a. In this preliminary vaporizing process, while operating the vacuum pump 264, the valve va5 is opened in a state where the va3 is closed so as not to supply the second precursor gas into the processing chamber 201 but exhaust the second precursor gas through a route bypassing the processing chamber 201. In the current embodiment, for example, Al(MMP)$_3$ is used as the second liquid material (Al precursor).

Furthermore, at this time, it is preferable that ozone gas be generated to use is as a reactant (oxidant). That is, oxygen gas is supplied from the oxygen gas supply source 230o to the ozonizer 229o to generate ozone gas in the ozonizer 229o. At this time, while operating the vacuum pump 264, the valve vo5 is opened in a state where the valve vo3 is closed so as not to supply the ozone gas into the processing chamber 201 but exhaust the ozone gas in a route bypassing the processing chamber 201.

It takes time to stably generate the first precursor gas and the second precursor gas in the vaporizers 229z and 229a or the ozone gas in the ozonizer 229o. That is, when the precursor gas or ozone gas is initially generated, the precursor gas or ozone gas is unstably supplied. Therefore, in the current embodiment, the first precursor gas, the second precursor gas, and the ozone gas are previously generated to obtain a state where the gases can be stably supplied, and by switching the valves vz3, vz5, va3, va5, vo3, and vo5, flow passages of the first precursor gas, the second precursor gas, and the ozone gas are changed. As a result, by switching the valves, stable supply of the first precursor gas, the second precursor gas, and the ozone gas can be rapidly started or stopped.

(First Precursor Supply Process S5)

Next, the valves vz4 and vz5 are closed, and the valve vz3 is opened to start supply of the first precursor gas into the processing chamber 201. The first precursor gas is distributed by the shower head 240 so that the precursor gas can be uniformly supplied to the wafer 200 disposed in the processing chamber 201. Surplus first precursor gas flows in the exhaust duct 259 and is exhausted to the exhaust outlet 260. When the first precursor gas is supplied into the processing chamber 201, so as to prevent permeation of the first precursor gas into the second precursor gas supply pipe 213a and the ozone gas supply pipe 213o and facilitate diffusion of the first precursor gas in the processing chamber 201, it is preferable that the valves va4 and vo4 be kept opened to continue supply of N$_2$ gas into the processing chamber 201.

After a predetermined time from the start of supply of the first precursor gas by opening the valve vz3, the valve vz3 is closed, and the valves vz4 and vz5 are opened to stop supply of the first precursor gas into the processing chamber 201. In addition, at the same time, the valve vz1 is also closed to stop supply of the first liquid material to the vaporizer 229z.

(Purge Process S6)

After stopping supply of the first precursor gas into the processing chamber 201 by closing the valve vz3, the valves vz4, va4, and vo4 are kept opened to continue supply of the N$_2$ gas into the processing chamber 201. The N$_2$ gas is supplied into the processing chamber 201 through the shower head 240 and flows in the exhaust duct 259 where the N$_2$ gas is exhausted to the exhaust outlet 260. In this way, the inside of the processing chamber 201 is purged with the N$_2$ gas to remove the first precursor gas remaining in the processing chamber 201.

(Oxidant Supply Process S7)

After the inside of the processing chamber 201 is purged, the valves vo4 and vo5 are closed, and the valve vo3 is opened to supply the ozone gas into the processing chamber 201 as an oxidant. The ozone gas is distributed by the shower head 240 and uniformly supplied to the wafer 200 disposed in the processing chamber 201. Surplus ozone gas or reaction byproducts may flow in the exhaust duct 259 and be exhaust through the exhaust outlet 260. When the ozone gas is supplied into the processing chamber 201, so as to prevent permeation of the ozone gas into the first precursor gas supply pipe 213z and the second precursor gas supply pipe 213a and facilitate diffusion of the ozone gas in the processing chamber 201, it is preferable that the valves vz4 and va4 be kept opened to continue supply of N$_2$ gas into the processing chamber 201.

After a predetermined time from the start of supply of the ozone gas by opening the valve vo3, the valve vo3 is closed, and the valves vo4 and vo5 are opened to stop supply of the ozone gas into the processing chamber 201.

(Purge Process S8)

After stopping supply of the ozone gas into the processing chamber 201 by closing the valve vo3, the valves vz4, va4, and vo4 are kept opened to continue supply of the N$_2$ gas into the processing chamber 201. The N$_2$ gas is supplied into the processing chamber 201 through the shower head 240 and flows in the exhaust duct 259 where the N$_2$ gas is exhausted to the exhaust outlet 260. In this way, the inside of the processing chamber 201 is purged with the N$_2$ gas to remove the ozone gas or reaction byproducts remaining in the processing chamber 201.

(Cycling Process S9)

Then, processes S5 to S8 are set as one cycle, and the cycle is performed predetermined times, for example, one to four times, so as to form a zirconium oxide (ZrO) film on the wafer 200 to a predetermined thickness (ZrO film forming process). At this time, the temperature of the wafer 200 is adjusted using the heater 206 to a predetermined processing temperature, for example, in the range from 200° C. to 350° C., preferably, 250° C. to 300° C., and the inside pressure of the processing chamber 201 is adjusted using the pressure regulator 262 to a predetermined processing pressure, for example, in the range from 50 Pa to 800 Pa, preferably, 100 Pa to 800 Pa. In addition, the flow rate of ZrCp(NMe$_2$)$_3$ supplied as the first liquid material is adjusted using the LMFC 221z to a predetermined supply flow rate, for example, in the range from 0.02 g/min to 0.4 g/min, and the flow rate of ozone (O$_3$) gas supplied as the oxidant is adjusted using the MFC 221o to a predetermined supply flow rate, for example, in the range from 500 sccm to 5000 sccm. Furthermore, in each ZrO film forming process, it is controlled so that the ZrO film is formed to a predetermined film thickness equal to or smaller than the above-described critical film thickness, for example, in the range from 0.8 Å to 4 Å. As described later, the film thickness of 0.8 Å is an ALD saturation film thickness of the ZrO film in each cycle. That is, the predetermined film thickness means a thickness equal to or greater than the ALD saturation film thickness but equal to or smaller than the critical film thickness.

(Second Precursor Supply Process S10)

Next, the valves va4 and va5 are closed, and the valve va3 is opened to start supply of the second precursor gas into the processing chamber 201. The second precursor gas is distributed by the shower head 240 so that the precursor gas can be uniformly supplied to the wafer 200 disposed in the processing chamber 201. Surplus second precursor gas flows in the exhaust duct 259 and is exhausted to the exhaust outlet 260. When the second precursor gas is supplied into the processing chamber 201, so as to prevent permeation of the second precursor gas into the first precursor gas supply pipe 213z and the ozone gas supply pipe 213o and facilitate diffusion of the second precursor gas in the processing chamber 201, it is preferable that the valves vz4 and vo4 be kept opened to continue supply of N$_2$ gas into the processing chamber 201.

After a predetermined time from the start of supply of the second precursor gas by opening the valve va3, the valve va3 is closed, and the valves va4 and va5 are opened to stop supply of the second precursor gas into the processing chamber 201. In addition, at the same time, the valve va1 is also closed to stop supply of the second liquid material to the vaporizer 229a.

(Purge Process S11)

After stopping supply of the second precursor gas into the processing chamber 201 by closing the valve va3, the valves vz4, va4, and vo4 are kept opened to continue supply of the $N_2$ gas into the processing chamber 201. The $N_2$ gas is supplied into the processing chamber 201 through the shower head 240 and flows in the exhaust duct 259 where the $N_2$ gas is exhausted to the exhaust outlet 260. In this way, the inside of the processing chamber 201 is purged with the $N_2$ gas to remove the second precursor gas remaining in the processing chamber 201.

(Oxidant Supply Process S12)

After the inside of the processing chamber 201 is purged, the valves vo4 and vo5 are closed, and the valve vo3 is opened to supply the ozone gas into the processing chamber 201 as an oxidant. The ozone gas is distributed by the shower head 240 and uniformly supplied to the wafer 200 disposed in the processing chamber 201. Surplus ozone gas or reaction byproducts may flow in the exhaust duct 259 and be exhaust through the exhaust outlet 260. When the ozone gas is supplied into the processing chamber 201, so as to prevent permeation of the ozone gas into the first precursor gas supply pipe 213z and the second precursor gas supply pipe 213a and facilitate diffusion of the ozone gas in the processing chamber 201, it is preferable that the valves vz4 and va4 be kept opened to continue supply of $N_2$ gas into the processing chamber 201.

After a predetermined time from the start of supply of the ozone gas by opening the valve vo3, the valve vo3 is closed, and the valves vo4 and vo5 are opened to stop supply of the ozone gas into the processing chamber 201.

(Purge Process S13)

After stopping supply of the ozone gas into the processing chamber 201 by closing the valve vo3, the valves vz4, va4, and vo4 are kept opened to continue supply of the $N_2$ gas into the processing chamber 201. The $N_2$ gas is supplied into the processing chamber 201 through the shower head 240 and flows in the exhaust duct 259 where the $N_2$ gas is exhausted to the exhaust outlet 260. In this way, the inside of the processing chamber 201 is purged with the $N_2$ gas to remove the ozone gas or reaction byproducts remaining in the processing chamber 201.

(Cycling Process S14)

Then, processes S10 to S13 are set as one cycle, and the cycle is performed predetermined times, for example, once, so as to form an aluminum oxide (AlO) film having a predetermined film thickness on the ZrO film formed on the wafer 200 (AlO film forming process). At this time, the temperature of the wafer 200 is adjusted using the heater 206 to a predetermined processing temperature, for example, in the range from 200° C. to 350° C., preferably, 250° C. to 300° C., and the inside pressure of the processing chamber 201 is adjusted using the pressure regulator 262 to a predetermined processing pressure, for example, in the range from 50 Pa to 800 Pa, preferably, 100 Pa to 800 Pa. That is, in the current embodiment, the temperature of the wafer 200 and the inside pressure of the processing chamber 201 in the AlO film forming process are controlled to be equal to the temperature of the wafer 200 and the inside pressure of the processing chamber 201 in the ZrO film forming process. When giving priority to increasing the growth rate of ZrO, the temperature of the wafer 200 may be kept in a relatively high-temperature range, for example, from 250° C. to 350° C. In addition, when giving priority to controlling the low concentration of AlO (keeping the adding amount of AlO at a low level, for example, 5% or lower), the temperature of the wafer 200 may be kept in a relatively low-temperature range, for example, from 200° C. to 250° C. In addition, the wafer 200 may be kept at different temperatures in the ZrO film forming process and the AlO film forming process, and in this case, if priority is given to controlling the low concentration of AlO, the temperature of the wafer 200 may be kept in the range from 150° C. to 350° C., preferably, 180° C. to 250° C. in the AlO film forming process. In addition, the processing chamber 201 may be kept at different pressures in the ZrO film forming process and the AlO film forming process. In addition, the flow rate of Al(MMP)$_3$ supplied as the second liquid material is adjusted using the LMFC 221a to a predetermined supply flow rate, for example, in the range from 0.02 g/min to 0.4 g/min, and the flow rate of ozone ($O_3$) gas supplied as the oxidant is adjusted using the MFC 221o to a predetermined supply flow rate, for example, in the range from 500 sccm to 5000 sccm. Furthermore, at this time, the thickness of the AlO film formed in each AlO film forming process is controlled based on the thickness of the ZrO film formed in each ZrO film forming process according to the composition of a ZrAlO film. For example, if the thickness of the ZrO film formed in each ZrO film forming process is set to 3.8 Å, to form a ZrAlO film having a composition ratio of ZrO:AlO=89:11 to 97.4:2.6, the thickness of the AlO film formed in each AlO film forming process is controlled to be in the range from 0.1 (=3.8×2.6/97.4) Å to 0.47 (3.8×11/89) Å. In this case, the thickness of the AlO film formed in each AlO film forming process is kept equal to or smaller than the critical film thickness.

Along with the AlO film forming process, the first precursor gas is generated (preliminary vaporization). In addition, along with the next ZrO film forming process, the second precursor gas is generated (preliminary vaporization).

(Repetition Process S15)

The ZrO film forming process from process S5 to process S9, and the AlO film forming process from process S10 to process S14 are grouped to one set, and the set is repeated predetermined times so as to form a zirconium aluminate (ZrAlO) film on the wafer 200 to a desired film thickness (ZrAlO film forming process). At this time, the film thickness of the ZrO film in each ZrO film forming process, and the film thickness of the AlO film in each AlO film forming process are set to predetermined film thicknesses equal to or smaller than the above-described critical film thicknesses (for example, the film thickness of the ZrO film is set to 3.8 Å, and the film thickness of the AlO film is set to 0.1 Å to 0.47 Å), so that the composition ratio of the ZrAlO film can be controlled to a desired ratio (for example, ZrO:AlO=89:11 to 97.4:2.6), and ZrO and AlO can diffuse more easily between the alternately stacked ZrO films and AlO films to make the composition ratio of the ZrAlO film uniform in the thickness (depth) direction of the ZrAlO film and in the surface direction of the wafer 200.

(Substrate Carrying-Out Process S16)

Thereafter, in the reverse order to that of the substrate carrying-in process S1 and the substrate placing process S2, the wafer 200, on which the ZrAlO film having a desired composition ratio is formed to a desired thickness, is carried out from the processing chamber 201 to the carrying chamber 271, thereby completing the substrate processing process of the current embodiment. Thereafter, an annealing treatment (heat treatment) is performed to the ZrAlO film formed on the wafer 200 to facilitate diffusion of ZrO and AlO, so that the composition ratio of the ZrAlO film can be more uniform in the film thickness direction of the ZrAlO film and in the surface direction of the wafer 200.

The ZrO film forming process is performed in CVD mode or ALD saturation mode.

When the ZrO film forming process is performed in CVD mode, the processing temperature (the temperature of the wafer 200) is adjusted to about the self-decomposition temperature of the first precursor gas, for example, 300° C. In this case, in the first precursor supply process S5, the first precursor gas decomposes by itself so that the ZrO film containing zirconium (Zr) can be formed (deposited) on the wafer 200, for example, to a thickness of about 0.8 Å to about 4 Å. In the oxidant supply process S7, the ozone gas removes impurities such as carbon (C) and hydrogen (H) from the ZrO film formed on the wafer 200 to a thickness of about 0.8 Å to 4 about Å.

When the ZrO film forming process is performed in CVD mode, one cycle constituted by the processes S5 to S8 can be performed once, and by controlling the supply time of the first precursor gas in the first precursor supply process S5, the thickness of the ZrO film can be controlled. Since a relatively high film forming rate can be obtained in CVD mode, the ZrO film forming process can be performed in a shorter time, and thus the productivity of the substrate processing process can be improved. FIG. 5 illustrates an example where the ZrO film is formed in CVD mode and the AlO film is formed in ALD unsaturation mode. The AlO film forming process in ALD unsaturation mode will be described later. In FIG. 5, the horizontal axes denotes time, and the vertical axes denotes gas supply flow rates. The film thickness (film forming rate) of the ZrO film in each ZrO film forming process can be adjusted by varying the supply flow rate of the first precursor gas, the temperature of the wafer 200, the inside pressure of the processing chamber 201 (the partial pressure of the first precursor gas), etc. as well as the supply time of the first precursor gas.

Figure 7:
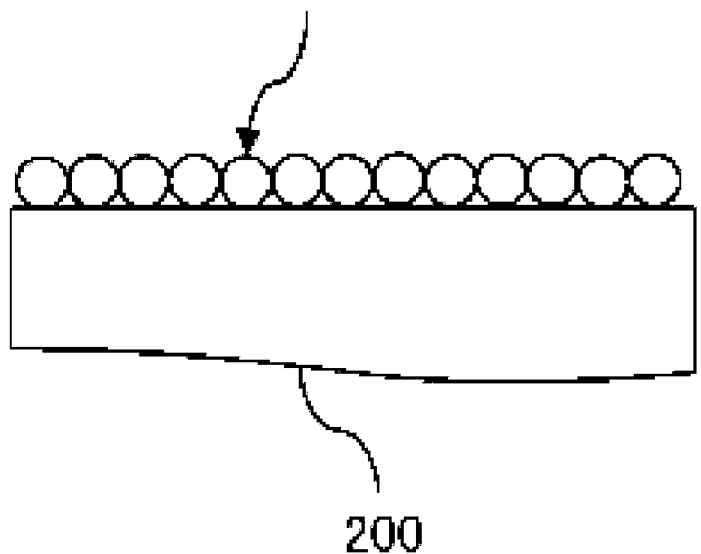
FIG. 7 is a schematic view illustrating an adsorbed state of a precursor gas on the surface of a wafer in ALD saturation mode.

When the ZrO film forming process is performed in ALD saturation mode, the processing temperature (the temperature of the wafer 200) is adjusted to a temperature where the first precursor gas does not decompose by itself, for example, 250° C. In this case, in the first precursor gas supply process S5, the first precursor gas is adsorbed on the wafer 200. At this time, the first precursor gas is supplied until the adsorbed amount of the first precursor gas reaches a saturation amount. The related state is illustrated in FIG. 7. As shown in FIG. 7, in the first precursor gas supply process S5, supply of the first precursor gas is stopped after adsorption of molecules of the first precursor gas on the wafer 200 is saturated to a state where self limit effect occurs (a state where molecules of the first precursor gas cannot be further adsorbed). Thereafter, in the oxidant supply process S7, the first precursor adsorbed on the wafer 200 reacts with ozone gas, and thus the ZrO film is formed on the wafer 200 to an ALD saturation film thickness of about 0.8 Å. At this time, the ozone gas removes impurities such as carbon (C) and hydrogen (H) that tend to enter the ZrO film.

When the ZrO film forming process is performed in ALD saturation mode, since supply of the first precursor gas is stopped after the adsorbed amount of the first precursor gas on the wafer 200 reaches a saturation amount as described above, the adsorbed amount of the first precursor gas on the wafer 200 can be stably maintained at the time when the first precursor gas supply process S5 is completed, and the thickness of the ZrO film formed in each cycle can be stably maintained. Therefore, by adjusting the execution number of the cycle constituted by the processes S5 to S8, the thickness of the ZrO film can be controlled with good repeatability. For example, by performing the above-described cycle three times, the ZrO film can be formed to a thickness of, for example, 2.4 Å(=0.8 Å/cycle×3 cycles) with good repeatability, and by performing the cycle four times, the ZrO film can be formed to a thickness of, for example, 3.2 Å(=0.8 Å/cycle×4 cycles) with good repeatability. FIG. 6 illustrates an example where the ZrO film forming process is performed in ALD saturation mode and the AlO film forming process is performed in ALD unsaturation mode. In the example shown in FIG. 6, the above-described cycle is performed four times in the ZrO film forming process. In FIG. 6, the horizontal axes denote time, and the vertical axes denote supply flow rates.

In addition, the AlO film forming process is performed in ALD unsaturation mode.

Figure 8:
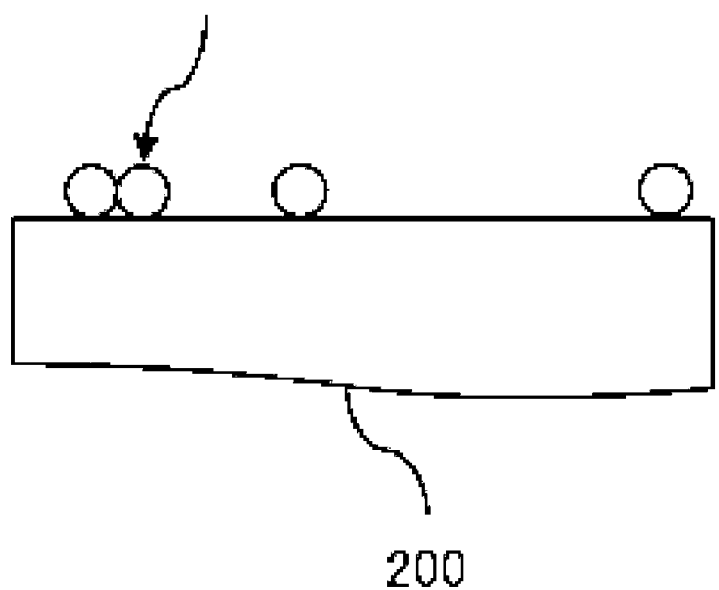
FIG. 8 is a schematic view illustrating an adsorbed state of a precursor gas on the surface of a wafer in ALD unsaturation mode.

When the AlO film forming process is performed in ALD unsaturation mode, the processing temperature (the temperature of the wafer 200) is adjusted to a temperature where the second precursor gas does not decompose by itself, for example, in the range from 250° C. to 300° C. In this case, in the second precursor gas supply process S10, the second precursor gas is adsorbed on the wafer 200. However, supply of the second precursor gas is stopped before the adsorbed amount of the second precursor gas reaches a saturation amount. The related state is illustrated in FIG. 8. As shown in FIG. 8, in the second precursor gas supply process S10, supply of the second precursor gas is stopped before adsorption of molecules of the second precursor gas on the wafer 200 is saturated to a state where self limit effect occurs (a state where molecules of the second precursor gas can be further adsorbed). Thereafter, in the oxidant supply process S12, the second precursor adsorbed on the wafer 200 reacts with ozone gas, and thus the AlO film is formed on the wafer 200 to a thickness smaller than an ALD saturation film thickness, for example, the AlO film is formed to a thickness of about 0.1 Å to about 0.47 Å. At this time, the ozone gas removes impurities such as carbon (C) and hydrogen (H) that tend to enter the AlO film.

When the AlO film forming process is performed in ALD unsaturation mode, since supply of the second precursor gas is stopped before the adsorbed amount of the second precursor gas on the wafer 200 reaches a saturation amount as described above, the adsorbed amount of the second precursor gas on the wafer 200 can be reduced at the time when the second precursor gas supply process S10 is completed, and thus the thickness of the AlO film formed in each cycle can be very small as compared with the case of ALD saturation mode. That is, the thickness of the AlO film formed in each AlO film forming process can be controlled to a very small level based on the thickness of the ZrO film formed in each ZrO film forming process according to the composition of a ZrAlO film. The adsorbed amount of the second precursor gas on the wafer 200 (the thickness of the AlO film formed in each AlO film forming process) can be adjusted by varying the supply flow rate of the second precursor gas, the temperature of the wafer 200, the inside pressure of the processing chamber 201, the partial pressure of the second precursor gas in the processing chamber 201, etc. as well as the supply time of the second precursor gas. The partial pressure of the second precursor gas in the processing chamber 201 can be adjusted by supplying dilution gas such as inert gas into the processing chamber 201 together with the second precursor gas in the second precursor supply process S10.

(3) Effects of Current Embodiments

According to the current embodiments, one or more of the following effects can be obtained.

According to the current embodiments, the thickness of a ZrO film, which contains Zr having the highest-concentration among a plurality of metal elements (Zr, Al) constituting a ZrAlO film, is controlled in each ZrO film forming process so that the thickness of the ZrO film can be a predetermined thickness equal to or smaller than the above-described critical film thickness, for example, a thickness ranging from 0.8 Å to 4 Å. In addition, the thickness of an AlO film formed in each AlO film forming process can be controlled to be equal to or smaller than the above-described critical film thickness. Therefore, by repeating predetermined times a set constituted by the ZrO film forming process and the AlO film forming process, a zirconium aluminate (ZrAlO) film can be formed on a wafer 200 to a predetermined thickness. In this way, by controlling the thickness of the ZrO film formed in each ZrO film forming process to be equal to or smaller than the above-described critical film thickness (by controlling the thickness of the AlO film forming in each AlO film forming process to be equal to or smaller than the above-described critical film thickness), reciprocal diffusion of ZrO and AlO can be facilitated between alternately stacked ZrO films and AlO films. Therefore, the composition ratio of the ZrAlO film can be uniform in the thickness (depth) direction of the ZrAlO film and the surface direction of the wafer 200. This is effective when the concentration (proportion) of an element among a plurality of elements constituting a metal oxide film is controlled within several percents (%), for example, 4% to 5%. That is, particularly, low-concentration controlling can be effectively carried out.

According to the current embodiments, an AlO film containing Al which is one of a plurality of metal elements (Zr, Al) constituting a ZrAlO film and having a concentration lower than that of Zr is formed in ALD unsaturation mode. As described above, in ALD unsaturation mode, supply of the second precursor gas is stopped before the adsorbed amount of the second precursor gas on the wafer 200 reaches a saturation amount, so that the adsorbed amount of the second precursor gas on the wafer 200 can be reduced at the time when the second precursor gas supply process S10 is completed, and the thickness of the AlO film formed in each cycle can be very small as compared with the case of ALD saturation mode That is, the thickness of the AlO film formed in each AlO film forming process can be controlled to a very small level based on the thickness of the ZrO film (which is a metal oxide film containing a metal element having the highest-concentration) formed in each ZrO film forming process according to the composition of a ZrAlO film. For example, in the case of forming a ZrAlO film having a predetermined composition ratio (low-concentration AlO) in the range of ZrO:AlO=89:11 to 97.4:2.6, if the thickness of a ZrO film in each ZrO film forming process is set to 3.8 Å, the thickness of the AlO film in each AlO film forming process can be controlled to be very thin in the range from 0.1 Å to 0.47 Å according to the composition ratio of the ZrAlO film.

According to the current embodiments, a ZrO film containing Zr which is one of a plurality of metal elements (Zr, Al) constituting a ZrAlO film and having the highest-concentration in the ZrAlO film is formed in CVD mode or ALD saturation mode. If the ZrO film forming process is performed in CVD mode, since a relatively high film forming rate can be obtained, the processing time of the ZrO film forming process can be reduced, and the productivity of the substrate processing process can be improved. In addition, if the ZrO film forming process is performed in ALD saturation mode, since supply of the first precursor gas is stopped after the adsorbed amount of the first precursor gas reaches a saturation amount as described above, the adsorbed amount of the first precursor gas on the wafer 200 can be stably maintained at the time when the first precursor gas supply process S5 is completed, and the thickness of the ZrO film formed in each cycle can be stably maintained. Therefore, by adjusting the execution number of the cycle constituted by the processes S5 to S8, the thickness of the ZrO film can be controlled with good repeatability. In this way, by stabilizing the composition ratio of the ZrAlO film, substrate processing quality can be improved.

According to the current embodiments, the temperature of the wafer 200 in the ZrO film forming process can be kept equal to the temperature of the wafer 200 in the AlO film forming process. That is, the cycling process S9 in which the cycle constituted by the processes S5 to S8 is performed predetermined times can be performed at the same temperature (for example, 250° C. to 300° C.) as the cycling process S14 in which the cycle constituted by the processes S10 to S13 is performed predetermined times. In this case, temperature adjusting time (wait time) may not be necessary during the substrate processing process, and thus the productivity of the substrate processing process can be improved.

According to the current embodiments, the inside pressure of the processing chamber 201 in the ZrO film forming process can be kept equal to the inside pressure of the processing chamber 201 in the AlO film forming process.

That is, the cycling process S9 in which the cycle constituted by the processes S5 to S8 is performed predetermined times can be performed at the same pressure (for example, 100 Pa to 800 Pa) as the cycling process S14 in which the cycle constituted by the processes S10 to S13 is performed predetermined times. In this case, pressure adjusting time (wait time) may not be necessary during the substrate processing process, and thus the productivity of the substrate processing process can be improved.

According to the current embodiments, in the oxidant supply process S7, impurities such as carbon (C) and hydrogen (H) can be removed from the ZrO film formed in CVD mode by ozone gas, and impurities such as carbon (C) and hydrogen (H) which tend to enter the ZrO film formed in ALD saturation mode can be removed by ozone gas. In addition, in the oxidant supply process S12, impurities such as carbon (C) and hydrogen (H) which tend to enter the AlO film formed in ALD unsaturation mode can be removed by ozone gas. Therefore, the quality of the ZrAlO film can be improved.

<Another Embodiment of Invention>

While the present invention has been particularly described with reference to the embodiments, the present invention is not limited to the embodiments, but various changes and modifications may be made in the present invention without departing from the scope of the invention.

For example, although the first metal element is Zr and the second metal element is Al in the above-described embodiments, the present invention is not limited thereto. That is, the first metal element may be any one of Hf (hafnium), Ti (titanium), Al (aluminum), La (lanthanum), Si (silicon), Nb (niobium), Sr (Strontium), Ba (barium), Ta (tantalum), and Y (yttrium); and the second metal element may be any one of Hf (hafnium), Ti (titanium), Al (aluminum), La (lanthanum), Si (silicon), Nb (niobium), Sr (strontium), Ba (barium), Ta (tantalum), and Y (yttrium). For example, the present invention can be suitably applied to the case where the first metal element is Hf, the second metal element is Al, and hafnium aluminate (HfAlO) film is formed as a third metal oxide film.

In the above-described embodiments, an explanation is given on the exemplary case of controlling the composition ratio of a metal oxide film constituted by two kinds of metal elements. However, the present invention can be applied to other cases where the composition ratio of a metal oxide film constituted by three or more kinds of metal elements is controlled.

Furthermore, in the above-described embodiments, an explanation is given on the case of performing a film forming process using a single-wafer type substrate processing apparatus configured to process a substrate at a time. However, the present invention is not limited thereto. For example, a batch type vertical apparatus configured to process a plurality of substrates at a time may be used as a substrate processing apparatus to perform a substrate processing process. Hereinafter, such a vertical apparatus will be explained.

Figure 15A:
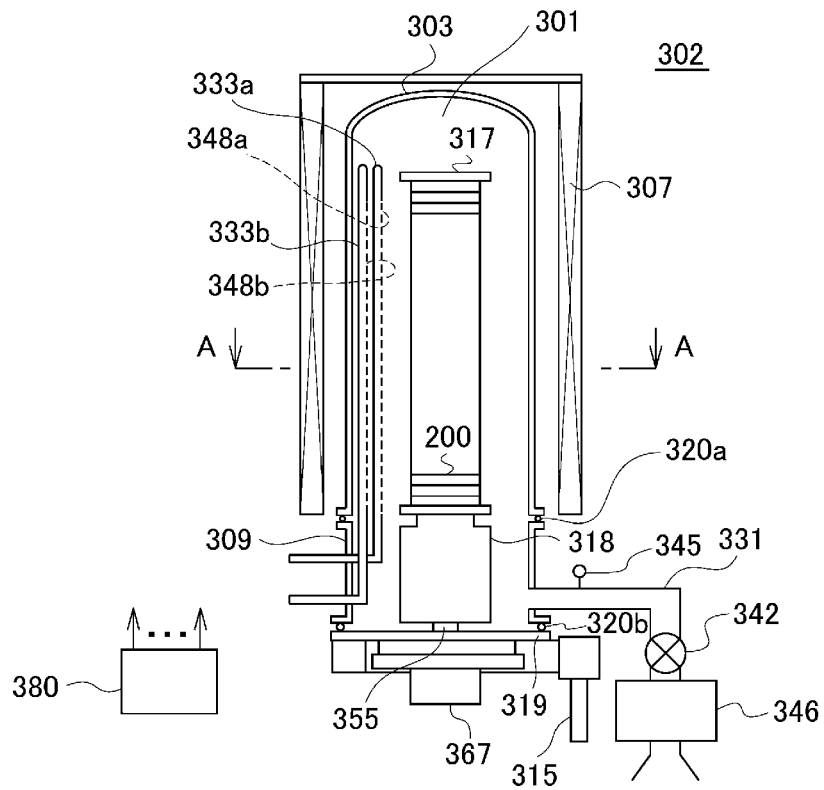
Figure 15B:
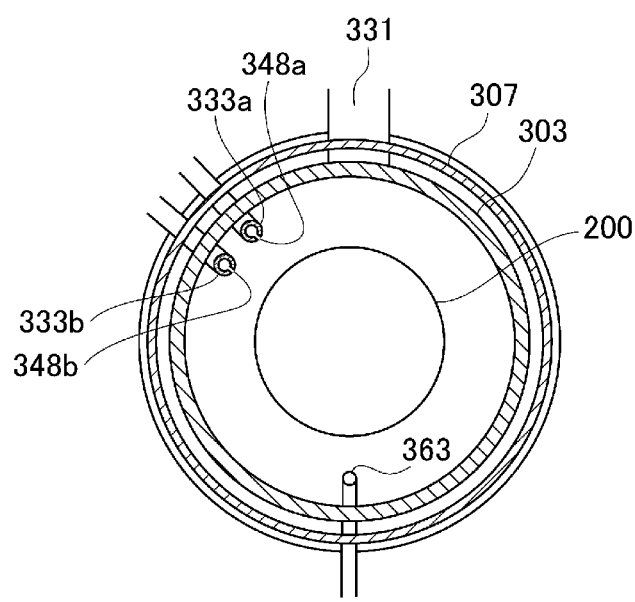

FIG. 15A and FIG. 15B are schematic views illustrating a vertical processing furnace 302 of a vertical apparatus that can be suitable used according to an embodiment of the present invention, in which FIG. 15A is a vertical sectional view of the processing furnace 302, and FIG. 15B is a sectional view of the processing furnace 302 taken along line A-A of FIG. 15A.

As shown in FIG. 15A, the processing furnace 302 includes a heater 307 as a heating unit (heating mechanism). The heater 307 has a cylindrical shape and is vertically installed in a state where the heater 307 is supported on a heater base (not shown) which is a holding plate.

Inside the heater 307, a process tube 303 is installed concentrically with the heater 307 as a reaction tube. The process tube 303 is made of a heat-resistant material such as quartz ($SiO_2$) and silicon carbide (SiC) and has a cylindrical shape with a closed top side and an opened bottom side. In the hollow part of the process tube 303, a processing chamber 301 is formed, which is configured to accommodate substrates such as wafers 200 in a state where the wafers 200 are horizontally positioned and vertically arranged in multiple stages in a boat 317 (described later).

At the lower side of the process tube 303, a manifold 309 is installed concentrically with the process tube 303. The manifold 309 is made of a material such as stainless steel and has a cylindrical shape with opened top and bottom sides. The manifold 309 is engaged with the process tube 303 and installed to support the process tube 303. Between the manifold 309 and the process tube 303, an O-ring 320a is installed as a seal member. The manifold 309 is supported by the heater base such that the process tube 303 can be vertically fixed. The process tube 303 and the manifold 309 constitute a reaction vessel.

A first nozzle 333a as a first gas introducing part, and a second nozzle 33b as a second gas introducing part are connected to the manifold 309 in a manner such that the first and second nozzles 333a and 333b penetrate the sidewall of the manifold 309. Each of the first and second nozzles 333a and 333b has an L-shape with a horizontal part and a vertical part. The horizontal part is connected to the manifold 309, and the vertical part is erected in an arc-shaped space between the inner wall of the process tube 303 and the wafers 200 along the inner wall of the process tube 303 from the bottom side to the top side in the arranged direction of the wafers 200. In the lateral sides of the vertical parts of the first and second nozzles 333a and 333b, first gas supply holes 348a and second gas supply holes 348b are formed, respectively. The first and second gas supply holes 348a and 348b have the same size and are arranged at the same pitch from the lower side to the upper side.

The same gas supply systems as those explained in the previous embodiment are connected to the first and second nozzles 333a and 333b. However, the current embodiment is different from the above-described embodiments, in that the precursor gas supply pipe 213 is connected to the first nozzle 333a, and the ozone gas supply pipe 213o is connected to the second nozzle 333b. That is, in the current embodiment, precursor gases (the first precursor gas and the second precursor gas) are supplied through a nozzle different from that used to supply ozone gas. In addition, the precursor gases may be supplied through different nozzles.

At the manifold 309, an exhaust pipe 331 is installed to exhaust the inside atmosphere of the processing chamber 301. A vacuum exhaust device such as a vacuum pump 346 is connected to the exhaust pipe 331 through a pressure detector such a pressure sensor 345 and a pressure regulator such as an auto pressure controller (APC) valve 342, and based on pressure information detected by the pressure sensor 345, the APC valve 342 is controlled so that the inside of the processing chamber 301 can be vacuum-evacuated to a predetermined pressure (vacuum degree). The APC valve 342 is an on-off valve configured to be opened and closed to start and stop vacuum evacuation of the inside of the processing chamber 301, and configured to be adjusted in its valve opening degree for adjusting the inside pressure of the processing chamber 301.

At the lower side of the manifold 309, a seal cap 319 is installed as a furnace port cover capable of hermetically closing the opened bottom side of the manifold 309. The seal cap 319 is configured to be brought into contact with the manifold 309 in a vertical direction from the bottom side of the manifold 309. The seal cap 319 is made of a metal such as stainless steel and has a circular disk shape. On the top surface of the seal cap 319, an O-ring 320b is installed as a seal member configured to make contact with the bottom side of the manifold 309. At a side of the seal cap 319 opposite to the processing chamber 301, a rotary mechanism 367 is installed to rotate the boat 317 (described later). A rotation shaft 355 of the rotary mechanism 367 is inserted through the seal cap 319 and is connected to the boat 317, so as to rotate the wafers 200 by rotating the boat 317. The seal cap 319 is configured to be vertically moved by a boat elevator 315 which is disposed at the outside of the process tube 303 as an elevating mechanism, and by this, the boat 317 can be loaded into and out of the processing chamber 301.

The boat 317 which is a substrate holding tool is made of a heat-resistant material such as quartz or silicon carbide and is configured to hold a plurality of wafers 200 in a state where the wafers 200 are horizontally positioned and arranged in multiple stages with the centers of the wafers 200 being aligned. At the lower part of the boat 317, an insulating member 318 made of a heat-resistant material such as quartz or silicon carbide is installed so as to prevent heat transfer from the heater 307 to the seal cap 319. In the process tube 303, a temperature sensor 363 is installed as a temperature detector, and based on temperature information detected by the temperature sensor 363, power supplied to the heater 307 is controlled to obtain a desired temperature distribution in the processing chamber 301. Like the first nozzle 333a and the second nozzle 333b, the temperature sensor 363 is installed along the inner wall of the process tube 303.

A controller 380 which is a control unit (control part) is configured to control operations of parts such as the APC valve 342, the heater 307, the temperature sensor 363, the vacuum pump 346, the rotary mechanism 367, the boat elevator 315, the valves vz1 to vz6, va1 to va6, and vo3 to vo6, the LMFCs 221z and 221a, and the MFCs 224z, 224a, 221o, 222o, 224o, 225z, and 225a.

Next, an explanation will be given on a substrate processing process for forming thin films on wafers 200 by an ALD method using the above-described processing furnace 302 of the vertical apparatus, as one of semiconductor device manufacturing processes. In the following description, each part of the vertical apparatus is controlled by the controller 380.

A plurality of wafers 200 are charged into the boat 317 (wafer charging). Then, as shown in FIG. 15A, the boat 317 in which the plurality of wafers 200 are held is lifted and loaded into the processing chamber 301 by the boat elevator 315 (boat loading). In this state, the bottom side of the manifold 309 is sealed by the seal cap 319 with the O-ring 320b being disposed therebetween.

The inside of the processing chamber 301 is vacuum-evacuated by the vacuum pump 346 to a desired pressure (vacuum degree). At this time, the inside pressure of the processing chamber 301 is measured by the pressure sensor 345, and based on the measured pressure, the APC valve 342 is feedback-controlled. In addition, the inside of the processing chamber 301 is heated by the heater 307 to a desired temperature. At this time, so as to obtain a desired temperature distribution in the processing chamber 301, power supplied to the heater 307 is feedback-controlled based on temperature information detected by the temperature sensor 363. Then, the rotary mechanism 367 rotates the boat 317 to rotate the wafers 200.

Thereafter, for example, like in the above-described embodiments, a set constituted by the ZrO film forming process from process S5 to process S9 and the AlO film forming process from process S10 to process S14 is repeated predetermined times (repetition process S15), so as to form zirconium aluminate (ZrAlO) films on the wafers 200 to a predetermined thickness.

After that, the boat elevator 315 lowers the seal cap 319 to open the bottom side of the manifold 309 and unload the boat 317 from the process tube 303 through the opened bottom side of the manifold 309 in a state where the wafers 2 on which the ZrAlO films having a predetermined thickness are formed are held in the boat 317 (boat unloading). Thereafter, the processed wafers 200 are discharged from the boat 317 (wafer discharging).

EXPERIMENTAL EXAMPLES

Hereinafter, experimental examples will be explained.
(Formation of ZrO Film in CVD Mode)

Figure 11:
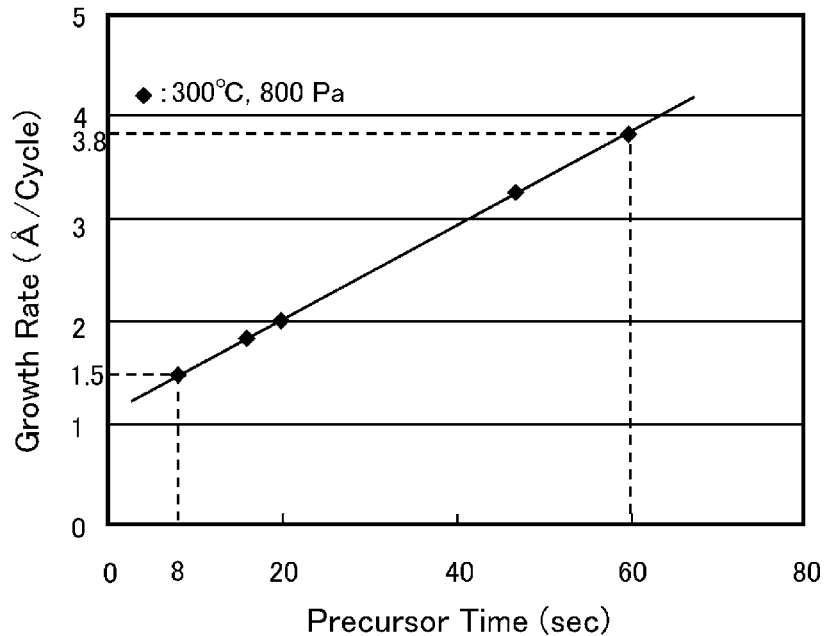
FIG. 11 is a graph showing a relationship between Zr precursor supply time and ZrO film thickness in each cycle (CVD mode).

First, in a processing chamber in which a wafer was accommodated, a cycle of Zr precursor introduction→Zr precursor purge→oxidant introduction→oxidant purge was repeated a plurality of times to form a ZrO film on the wafer. FIG. 11 shows a relationship between Zr precursor supply time and ZrO film thickness in each cycle. In FIG. 11, the horizontal axis denotes Zr precursor supply time (sec) per cycle, and the vertical axis denotes the thickness of the ZrO film per cycle (Å/cycle). Film forming conditions were as follows. Wafer temperature in each process: 300° C., processing chamber pressure in each process: 800 Pa, Zr precursor: $ZrCp(NMe_2)_3$, oxidant: $O_3$, supply flow rate of $ZrCp(NMe_2)_3$: 0.25 g/min, $O_3$ gas supply flow rate: 2000 sccm, and Zr precursor supply time: 8 sec to 60 sec.

Referring to the drawing, it can be understood that: when the wafer temperature is 300° C., if the Zr precursor supply time per cycle is 8 seconds, the thickness of the ZrO film formed in each cycle is about 1.5 Å, and if the Zr precursor supply time per cycle is 60 seconds, the thickness of the ZrO film formed in each cycle is about 3.8 Å. In the film forming process performed using $ZrCp(NMe_2)_3$ at the wafer temperature of 300° C., since the thickness of the ZrO film per cycle varies according to the Zr precursor supply time, it can be understood that the film forming process is not an ALD saturation mode process but a CVD mode process. In addition, it can be understood that: at the wafer temperature of 300° C., the thickness of the ZrO film per cycle can be controlled within 1.5 Å to 3.8 Å by adjusting the Zr precursor supply time per cycle.

(Formation of ZrO Film in ALD Saturation Mode)

Figure 12:
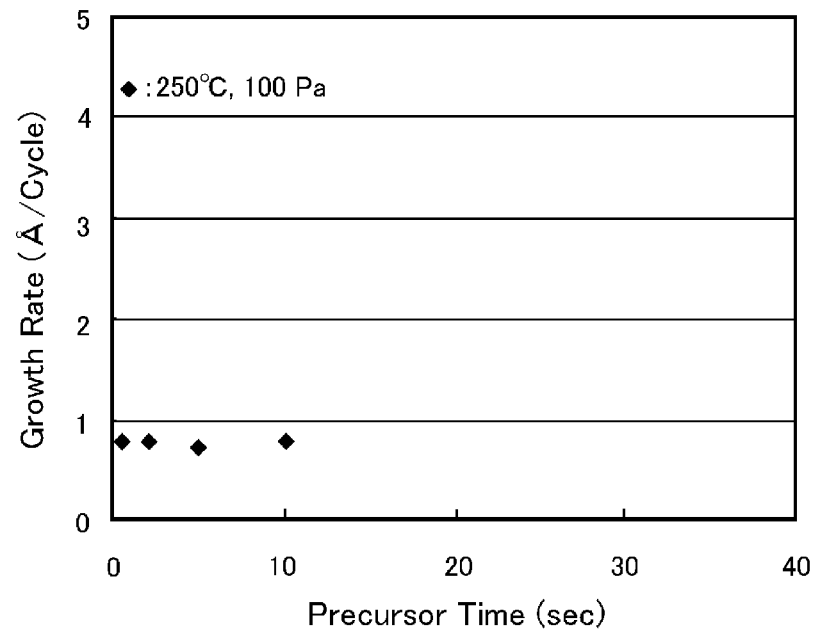
FIG. 12 is a graph showing a relationship between Zr precursor supply time and ZrO film thickness in each cycle (ALD saturation mode).

Next, wafer temperature and the inside pressure of the processing chamber were reduced, and a cycle of Zr precursor introduction into the processing chamber in which the wafer was accommodated→Zr precursor purge→oxidant introduction→oxidant purge was repeated a plurality of times to form a ZrO film on the wafer. FIG. 12 shows a relationship between Zr precursor supply time and ZrO film thickness in each cycle. In FIG. 12, the horizontal axis denotes Zr precursor supply time (sec) per cycle, and the vertical axis denotes the thickness of the ZrO film per cycle (Å/cycle). Film forming conditions were as follows. Wafer temperature in each process: 250° C., processing chamber pressure in each process: 100 Pa, Zr precursor: $ZrCp(NMe_2)_3$, oxidant: $O_3$, supply flow rate of $ZrCp(NMe_2)_3$: 0.25 g/min, supply flow rate of $O_3$ gas: 2000 sccm, and Zr precursor supply time: 2 sec to 10 sec.

Referring to the drawing, it can be understood that: when the wafer temperature is 250° C. and the inside temperature of the processing chamber is 100 Pa, the thickness of the ZrO film formed in each cycle is always stable at about 0.8 Å in the Zr precursor supply time range of 2 seconds to 10 seconds. Since the thickness of the ZrO film per cycle does not vary according to the Zr precursor supply time, it can be understood that the film forming process performed using $ZrCp(NMe_2)_3$ at the wafer temperature of 250° C. and the processing chamber pressure of 100 Pa is not a CVD mode process but an ALD saturation mode process. In addition, it can be understood that the thickness of the ZrO film can be controlled with good repeatability by adjusting the iteration number of the cycle of Zr precursor introduction→Zr precursor purge→oxidant introduction→oxidant purge.

(Formation of AlO Film in ALD Unsaturation Mode)

Figure 13:
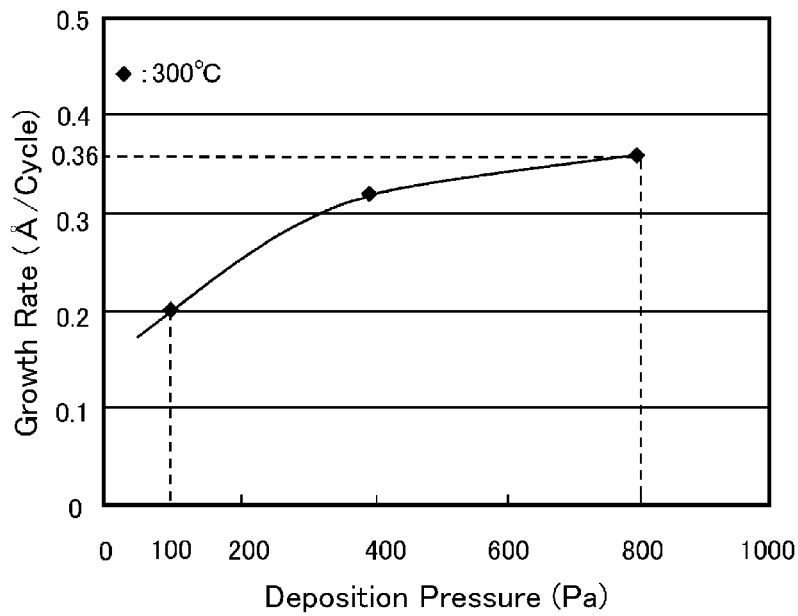
FIG. 13 is a graph showing a relationship between the inside pressure of a processing chamber pressure and AlO film thickness in each cycle.

Next, a cycle of Al precursor introduction into the processing chamber in which the wafer was accommodated→Al precursor purge→oxidant introduction→oxidant purge was repeated a plurality of times to form a AlO film on the wafer. FIG. 13 shows a relationship between processing chamber pressure and AlO film thickness in each cycle. In FIG. 13, the horizontal axis denotes processing chamber pressure (Pa), and the vertical axis denotes the thickness of the AlO film per cycle (Å/cycle). Film forming conditions were as follows. Wafer temperature in each process: 300° C., Al precursor: $Al(MMP)_3$, oxidant: $O_3$, supply flow rate of $Al(MMP)_3$: 0.03 g/min, supply flow rate of $O_3$ gas: 2000 sccm, and Al precursor supply time: 2 sec. In each process, the pressure inside the processing chamber was varied in the range from 100 Pa to 800 Pa.

Referring to the drawing, it can be understood that: when the wafer temperature is 300° C. and the processing chamber pressure is 100 Pa, the thickness of the AlO film per cycle is about 0.2 Å. In addition, it can be understood that: when the wafer temperature is 300° C. and the processing chamber pressure is 800 Pa, the thickness of the AlO film per cycle is about 0.36 Å. That is, when the wafer temperature is 300° C., by varying the processing chamber pressure (or the partial pressure of the Al precursor in the processing chamber), the thickness of the AlO film per cycle can be adjusted in the range from 0.2 Å to 0.36 Å.

Figure 14:
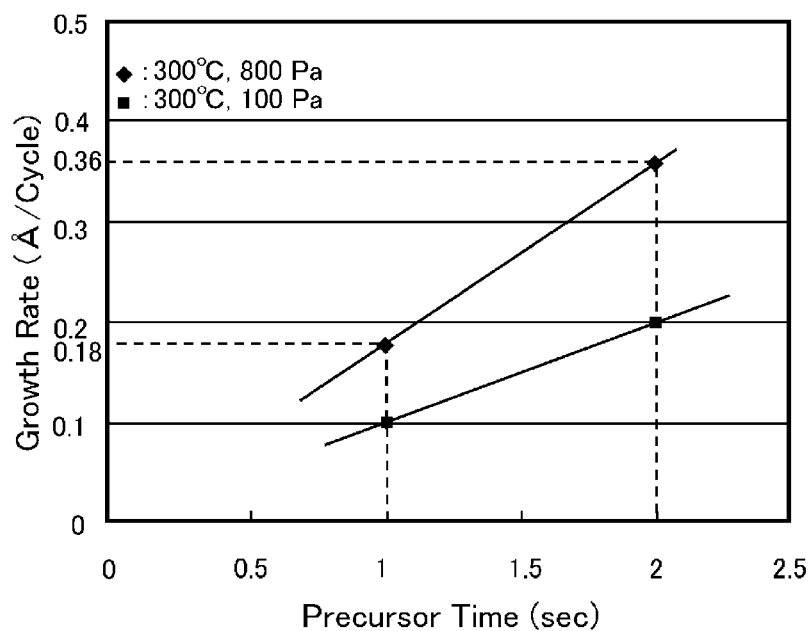
FIG. 14 is a graph showing a relationship between Al precursor supply time and AlO film thickness in each cycle, in which symbol ♦ denotes the case where the inside pressure of a processing chamber is 800 Pa, and symbol ■ denotes the case where the inside pressure of the processing chamber is 100 Pa.

In addition, a cycle of Al precursor introduction into the processing chamber in which the wafer was accommodated→Al precursor purge→oxidant introduction→oxidant purge was repeated a plurality of times to form a AlO film on the wafer. FIG. 14 shows a relationship between Al precursor supply time per cycle and AlO film thickness per cycle. In FIG. 14, the horizontal axis denotes Al precursor supply time (sec) per cycle, and the vertical axis denotes the thickness of the AlO film per cycle (Å/cycle). Film forming conditions were as follows. Wafer temperature in each process: 300° C., and processing chamber pressure in each process: 100 Pa and 800 Pa (In FIG. 14, symbol ♦ denotes the case where the inside pressure of the processing chamber is 800 Pa, and symbol ■ denotes the case where the inside pressure of the processing chamber is 100 Pa). Al precursor: Al(MMP)$_3$, oxidant: O$_3$, supply flow rate of Al(MMP)$_3$: 0.03 g/min, supply flow rate of O$_3$ gas: 2000 sccm, and Al precursor supply time: 1 to 2 sec.

Referring to the drawing, when the Al precursor supply time is 1 second and the processing chamber process is 100 Pa, the thickness of the AlO film per cycle is about 0.1 Å, and when the Al precursor supply time is 1 second and the processing chamber process is 800 Pa, the thickness of the AlO film per cycle is about 0.18 Å. In addition, when the Al precursor supply time is 2 seconds and the processing chamber process is 100 Pa, the thickness of the AlO film per cycle is about 0.2 Å, and when the Al precursor supply time is 2 seconds and the processing chamber process is 800 Pa, the thickness of the AlO film per cycle is about 0.36 Å. That is, when the film forming process is performed using the precursor at a processing temperature of 300° C., in any of the case where the processing chamber pressure is 100 Pa and the case where the processing chamber pressure is 800 Pa, the thickness of the AlO film per cycle is varied according to the Al precursor supply time, and the thickness of the AlO film is smaller than an ALD saturation film thickness. Therefore, it can be understood that ALD adsorption is not yet saturated, that is, the film forming process is performed in ALD unsaturation mode. Furthermore, it can be understood that when the pressure of the processing chamber is 800 Pa, the growth rate per cycle can be reduced from about 0.36 Å to about 0.18 Å by varying the Al precursor supply time from 2 seconds to 1 second.

(Summing Up)

Referring to FIG. 11 and FIG. 14, under the conditions where the wafer temperature is 300° C. and the processing chamber pressure is 800 Pa in each process, a ZrO film can be formed to a thickness of 3.8 Å by performing a cycle (1) of Zr precursor introduction (introduction time: 60 seconds)→Zr precursor purge→oxidant introduction→oxidant purge, and an AlO film can be formed to a thickness of 0.18 Å by performing a cycle (2) of Al precursor introduction (introduction time: 1 second)→Al precursor purge→oxidant introduction→oxidant purge. Furthermore, a set of the cycle (1) and cycle (2) can be repeated until a desired film thickness can be obtained so as to form a ZrAlO film (a film having a low-concentration AlO) having a ZrO:AlO composition ratio of, for example, 95.5:4.5. In this case, the concentration of AlO in the ZrAlO film is 4.5%.

Referring to FIG. 11 and FIG. 14, under the conditions where the wafer temperature is 300° C. and the processing chamber pressure is 800 Pa in each process, a ZrO film can be formed to a thickness of 1.5 Å to 3.8 Å by performing a cycle (1) of Zr precursor introduction (introduction time: 8 seconds to 60 seconds)→Zr precursor purge→oxidant introduction→oxidant purge, and under the conditions where the wafer temperature is 300° C. and the processing chamber pressure is 100 Pa in each process, an AlO film can be formed to a thickness of 0.1 Å by performing a cycle (2) of Al precursor introduction (introduction time: 1 second)→Al precursor purge→oxidant introduction→oxidant purge. Furthermore, a set of the cycle (1) and cycle (2) can be repeated until a desired film thickness can be obtained so as to form a ZrAlO film (a film having a low-concentration AlO) having a ZrO:AlO composition ratio of, for example, 93.75:6.25 to 97.4:2.6. In this case, the concentration of AlO in the ZrAlO film is 6.25% to 2.6%. In this way, by controlling the concentration of Al in the ZrAlO film to several percents (%), the permittivity of the ZrAlO film can be increased.

Referring to FIG. 12 and FIG. 14, under the conditions where the wafer temperature is 250° C. and the processing chamber pressure is 100 Pa in each process, a ZrO film can be formed to a thickness of 0.8 to 3.2 Å by performing a cycle (1) of Zr precursor introduction (introduction time: 2 seconds to 5 seconds)→Zr precursor purge→oxidant introduction→oxidant purge, and an AlO film can be formed to a thickness of 0.1 Å by performing a cycle (2) of Al precursor introduction (introduction time: 1 second)→Al precursor purge→oxidant introduction→oxidant purge. Furthermore, a set of the cycle (1) and cycle (2) can be repeated until a desired film thickness can be obtained so as to form a ZrAlO film (a film having a low-concentration AlO) having a ZrO:AlO composition ratio of, for example, 89:11 to 97:3. In this case, the concentration of AlO in the ZrAlO film is 11% to 3%. In this way, the thickness of the ZrO film may be adjusted by varying the iteration number of a saturation ALD film forming cycle. In this case, the substrate processing process may be performed according to gas supply timings as shown in the flowchart of FIG. 6.

As described above, by forming a ZrO film in CVD mode or ALD saturation mode, the thickness of the ZrO film can be adjusted to a predetermined thickness equal to or smaller than the above-described critical film thickness, for example, in the range from 0.8 Å to 4 Å. In addition, by forming a ZrO film in CVD mode or ALD mode and an AlO film in ALD unsaturation mode, a control for low-concentration AlO is possible at least in the range from ZrO:AlO=89:11 to ZrO:AlO=97.4:2.6 (the concentration of AlO in a ZrAlO film is 11% to 2.6%). In addition, the ZrO film forming process and the AlO film forming process can be performed at the same wafer temperature and the same processing chamber temperature.

According to the method of manufacturing a semiconductor device and the substrate processing apparatus of the present invention, when a third metal oxide film containing first and second metal elements is formed, the composition ratio uniformity of the third metal oxide film can be improved in the thickness direction of the third metal oxide film.

<Supplementary Note>

The present invention also includes the following preferred embodiments.

According to an embodiment of the present invention, there is provided a method of manufacturing a semiconductor device including alternately repeating a process of forming a first metal oxide film including a first metal element and a process of forming a second metal oxide film including a second metal element on a substrate accommodated in a processing chamber, so as to form a third metal oxide film including the first and second metal elements with a predetermined composition ratio on the substrate, wherein one metal element of the first and second metal elements of the third metal oxide film has a concentration higher than a concentration of the other metal element of the first and second metal elements, and one of the first and second metal oxide films including the higher-concentration metal element is formed in a chemical vapor deposition (CVD) mode or an atomic layer deposition (ALD) saturation mode, and the other of the first and second metal oxide films including the other metal element having a lower-concentration is formed in an ALD unsaturation mode.

Preferably, in the process of forming the metal oxide film including the higher-concentration metal element, a process of supplying a precursor including the higher-concentration metal element into the processing chamber and a process of supplying an oxidant into the processing chamber may alternately be repeated, and in the process of supplying the precursor, supply of the precursor may be stopped after a film including the higher-concentration metal element is deposited on the substrate by self decomposition of the precursor or adsorption of the precursor on the substrate is saturated, wherein in the process of forming the other metal oxide film including the lower-concentration metal element, a process of supplying a precursor including the lower-concentration metal element into the processing chamber and a process of supplying an oxidant into the processing chamber may alternately be repeated, and in the process of supplying the precursor, supply of the precursor may be stopped before adsorption of the precursor on the substrate is saturated.

Preferably, a first thickness of the metal oxide film including the higher-concentration metal element formed in each process may be set to 0.8 Å to 4 Å, and a second thickness of the other metal oxide film including the lower-concentration metal element formed in each process may be set to a thickness based on the first thickness of the metal oxide film according to the predetermined composition ratio of the third metal oxide film.

Preferably, in the process of forming the first metal oxide film and the process of forming the second metal oxide film, the substrate may be kept at the same temperature.

Preferably, in the process of forming the first metal oxide film and the process of forming the second metal oxide film, the processing chamber may be kept at the same pressure.

Preferably, in the process of forming the first metal oxide film, a first precursor including the first metal element, and an oxidant may alternately be supplied into the processing chamber, wherein in the process of forming the second metal oxide film, a second precursor including the second metal element, and an oxidant may alternately be supplied into the processing chamber.

Preferably, the first metal element may be zirconium and the first metal oxide film may be a zirconium oxide film; the second metal element may be aluminum and the second metal oxide film may be an aluminum oxide film; and the third metal oxide film may be a zirconium aluminate film.

Preferably, in the process of forming the first metal oxide film and the process of forming the second metal oxide film, the substrate may be kept at a temperature of 200° C. to 350° C.

Preferably, in the process of forming the first metal oxide film and the process of forming the second metal oxide film, the processing chamber may be kept at a pressure of 50 Pa to 800 Pa.

According to another embodiment of the present invention, there is provided a method of manufacturing a semiconductor device including repeating a process of sequentially forming at least two kinds of metal oxide films on a substrate so as to form a metal oxide film including at least two kinds of metal elements with a predetermined composition ratio on the substrate, wherein one of the at least two kinds of metal elements of the metal oxide film with the predetermined composition ratio has a highest-concentration of the at least two kinds of metal elements, and one of the at least two kinds of metal oxide films including the highest-concentration metal element is formed in a CVD mode or an ALD saturation mode, and the other of at least two kinds of metal oxide films including the metal element having a lower-concentration than the highest-concentration is formed in an ALD unsaturation mode.

According to another embodiment of the present invention, there is provided a method of manufacturing a semiconductor device including alternately repeating a process of forming a first metal oxide film including a first metal element and a process of forming a second metal oxide film including a second metal element on a substrate accommodated in a processing chamber, so as to form a third metal oxide film including the first and second metal elements with a predetermined composition ratio on the substrate, wherein one metal element of the first and second metal elements of the third metal oxide film has a concentration higher than a concentration of the other metal element of the first and second metal elements, a first thickness of the metal oxide film including the higher-concentration metal element formed in each process is set to 0.8 Å to 4 Å, and a second thickness of the other metal oxide film including the lower-concentration metal element formed in each process is set to a thickness based on the first thickness of the metal oxide film according to the predetermined composition ratio of the third metal oxide film.

According to another embodiment of the present invention, there is provided a substrate processing apparatus including: a processing chamber configured to accommodate a substrate; a heater configured to heat the substrate in the processing chamber; a first precursor supply system configured to supply a first precursor including a first metal element into the processing chamber; a second precursor supply system configured to supply a second precursor including a second metal element into the processing chamber; an oxidant supply system configured to supply an oxidant into the processing chamber; an exhaust system configured to exhaust an inside of the processing chamber; and a controller, wherein the controller is configured to control the first precursor supply system, the second precursor supply system, the oxidant supply system, the heater, and the exhaust system so as to: form a first metal oxide film including the first metal element by supplying the first precursor and the oxidant into the processing chamber in which the substrate is accommodated and exhausting the first precursor and the oxidant; form a second metal oxide film including the second metal element by supplying the second precursor and the oxidant into the processing chamber in which the substrate is accommodated and exhausting the second precursor and the oxidant; and form a third metal oxide film including the first and second metal elements with a predetermined composition ratio by alternately repeating the forming of the first metal oxide film and the forming of the second metal oxide film, wherein one metal element of the first and second metal elements of the third metal oxide film has a concentration higher than a concentration of the other metal element of the first and second metal elements, and one of the first and second metal oxide films including the higher-concentration metal element is formed in a CVD mode or an ALD saturation mode, and the other of the first and second metal oxide films including the other metal element having a lower-concentration is formed in an ALD unsaturation mode.

What is claimed is:
1. A method of manufacturing a semiconductor device comprising:
  alternately repeating a process of forming a first metal oxide film comprising a first metal element and a process of forming a second metal oxide film comprising a second metal element on a substrate accommodated in a processing chamber, so as to form a third metal oxide film comprising the first and second metal elements with a predetermined composition ratio on the substrate, wherein one metal element of the first and second metal elements of the third metal oxide film has a concentration higher than a concentration of the other metal element of the first and second metal elements, and one of the first and second metal oxide films comprising the higher-concentration metal element is formed in a chemical vapor deposition (CVD) mode or an atomic layer deposition (ALD) saturation mode, and the other of the first and second metal oxide films comprising the other metal element having a lower-concentration is formed in an ALD unsaturation mode.

2. The method of claim 1, wherein in the process of forming the metal oxide film comprising the higher-concentration metal element, a process of supplying a precursor comprising the higher-concentration metal element into the processing chamber and a process of supplying an oxidant into the processing chamber are alternately repeated, and in the process of supplying the precursor, supply of the precursor is stopped after a film comprising the higher-concentration metal element is deposited on the substrate by self decomposition of the precursor or adsorption of the precursor on the substrate is saturated, and wherein in the process of forming the other metal oxide film comprising the lower-concentration metal element, a process of supplying a precursor comprising the lower-concentration metal element into the processing chamber and a process of supplying an oxidant into the processing chamber are alternately repeated, and in the process of supplying the precursor, supply of the precursor is stopped before adsorption of the precursor on the substrate is saturated.

3. The method of claim 1, wherein a first thickness of the metal oxide film comprising the higher-concentration metal element formed in each process is set to 0.8 Å to 4 Å, and a second thickness of the other metal oxide film comprising the lower-concentration metal element formed in each process is set to a thickness based on the first thickness of the metal oxide film according to the predetermined composition ratio of the third metal oxide film.

4. The method of claim 1, wherein in the process of forming the first metal oxide film and the process of forming the second metal oxide film, the substrate is kept at the same temperature.

5. The method of claim 4, wherein in the process of forming the first metal oxide film and the process of forming the second metal oxide film, the processing chamber is kept at the same pressure.

6. The method of claim 5, wherein in the process of forming the first metal oxide film, a first precursor comprising the first metal element, and an oxidant are alternately supplied into the processing chamber, and wherein in the process of forming the second metal oxide film, a second precursor comprising the second metal element, and an oxidant are alternately supplied into the processing chamber.

7. The method of claim 1, wherein the first metal element is zirconium and the first metal oxide film is a zirconium oxide film;

the second metal element is aluminum and the second metal oxide film is an aluminum oxide film; and the third metal oxide film is a zirconium aluminate film.

8. The method of claim 7, wherein in the process of forming the first metal oxide film and the process of forming the second metal oxide film, the substrate is kept at a temperature of 200° C. to 350° C.

9. The method of claim 8, wherein in the process of forming the first metal oxide film and the process of forming the second metal oxide film, the processing chamber is kept at a pressure of 50 Pa to 800 Pa.

10. A method of manufacturing a semiconductor device comprising:

repeating a process of sequentially forming at least two kinds of metal oxide films on a substrate so as to form a metal oxide film comprising at least two kinds of metal elements with a predetermined composition ratio on the substrate, wherein one of the at least two kinds of metal elements of the metal oxide film with the predetermined composition ratio has a highest-concentration of the at least two kinds of metal elements, and one of the at least two kinds of metal oxide films comprising the highest-concentration metal element is formed in a CVD mode or an ALD saturation mode, and the other of at least two kinds of metal oxide films comprising the metal element having a lower-concentration than the highest-concentration is formed in an ALD unsaturation mode.

* * * * *